(12) United States Patent
Kim

(10) Patent No.: US 11,955,986 B2
(45) Date of Patent: Apr. 9, 2024

(54) COMPARATOR CIRCUIT INCLUDING FEEDBACK CIRCUIT

(71) Applicant: SAMSUNG ELECTRONICS CO., LTD., Suwon-si (KR)

(72) Inventor: Hyochang Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/096,696

(22) Filed: Jan. 13, 2023

(65) Prior Publication Data

US 2023/0370084 A1 Nov. 16, 2023

(30) Foreign Application Priority Data

May 13, 2022 (KR) .......... 10-2022-0059144

(51) Int. Cl.
H03M 1/46 (2006.01)
H03K 5/24 (2006.01)

(52) U.S. Cl.
CPC ............. H03M 1/46 (2013.01); H03K 5/24 (2013.01)

(58) Field of Classification Search
CPC ......... H03K 5/08; H03K 5/24; H03M 1/0607; H03M 1/46
See application file for complete search history.

(56) References Cited

U.S. PATENT DOCUMENTS

| | | | |
|---|---|---|---|
| 5,262,686 A | * | 11/1993 | Kurosawa ............ H03K 5/2481 341/162 |
| 5,546,028 A | | 8/1996 | Yamaguchi |
| 5,959,469 A | | 9/1999 | Kurauchi et al. |
| 6,608,503 B2 | | 8/2003 | Shenai et al. |
| 7,196,563 B2 | | 3/2007 | Yuki et al. |
| 7,336,123 B2 | | 2/2008 | Yoshida et al. |
| 8,149,019 B2 | | 4/2012 | Inoue |
| 8,890,565 B2 | | 11/2014 | Honda et al. |
| 11,211,922 B2 | | 12/2021 | Tsuji |

(Continued)

FOREIGN PATENT DOCUMENTS

| | | | | |
|---|---|---|---|---|
| JP | 63036610 A | * | 2/1988 | ............ C21C 1/025 |
| JP | 2006-279377 A | | 10/2006 | |
| JP | 4694214 B2 | | 3/2011 | |

*Primary Examiner* — Quan Tra
(74) *Attorney, Agent, or Firm* — Muir Patent Law, PLLC

(57) ABSTRACT

A comparator circuit, including an input circuit, first and second inverting amplification circuits, first and second coupling circuits, and a feedback circuit, wherein the input circuit generates an amplified input signal based on positive and negative input voltages, the first inverting amplification circuit generates an intermediate amplified signal based on the amplified input signal during a sampling period, the second inverting amplification circuit generates a comparison result signal based on the intermediate amplified signal during the sampling period, the first coupling circuit is connected between the input circuit and the first inverting amplification circuit, the second coupling circuit is connected between the first inverting amplification circuit and the second inverting amplification circuit, and the feedback circuit amplifies the input node of the first inverting amplification circuit with a rail-to-rail voltage corresponding to a power supply voltage or a ground voltage based on the comparison result signal during the sampling period.

19 Claims, 20 Drawing Sheets

(56) References Cited

U.S. PATENT DOCUMENTS

2002/0196054 A1\* 12/2002 Ohkido .................. H03K 5/249
　　　　　　　　　　　　　　　　　　　　　　327/65
2007/0103128 A1　　5/2007 Shin
2007/0103131 A1\* 5/2007 Shin ........................ H02M 3/07
　　　　　　　　　　　　　　　　　　　　　　323/280

\* cited by examiner

COMPARATOR CIRCUIT INCLUDING FEEDBACK CIRCUIT

CROSS-REFERENCE TO RELATED APPLICATION

This U.S. non-provisional application claims priority under 35 USC § 119 to Korean Patent Application No. 10-2022-0059144, filed on May 13, 2022, in the Korean Intellectual Property Office (KIPO), the disclosure of which is incorporated by reference herein in its entirety.

BACKGROUND

1. Field

Example embodiments relate generally to semiconductor integrated circuits, and more particularly to a comparator circuit including a feedback circuit.

2. Description of the Related Art

Comparators to compare two signals are widely used in various semiconductor devices and integrated circuits. For example, an analog-to-digital converter to convert an analog signal to a digital signal includes one or more comparators. In general, as more comparators are included in the analog-to-digital converter, the resolution of the analog-to-digital converter increases. Furthermore, comparators may be used to measure and monitor physical quantities such as temperature, voltage, current, time, and so on.

A chopper type comparator is widely used. The chopper type comparator has characteristics of low power consumption, high speed sampling, low voltage operation, and so on based on the removal of an offset through multi-stage amplification and an equalization operation (or auto-zero operation). However, power consumption of an integrated circuit increases as the number of comparators included in the integrated circuit increases.

SUMMARY

Embodiments are directed to a comparator circuit. Some example embodiments may provide a comparator circuit capable of reducing power consumption, a semiconductor device, and a system including the comparator circuit.

According to example embodiments, a comparator circuit may include an input circuit, a first inverting amplification circuit, a second inverting amplification circuit, a first coupling circuit, a second coupling circuit and a feedback circuit. The input circuit may generate an amplified input signal through a sampling node by alternately selecting a positive input voltage and a negative input voltage during an equalizing period and a sampling period. The first inverting amplification circuit may generate an intermediate amplified signal by performing an inversion and amplification operation based on the amplified input signal during the sampling period. The second inverting amplification circuit may generate a comparison result signal by performing an inversion and amplification operation based on the intermediate amplified signal during the sampling period. The first coupling circuit may be connected between the input circuit and an input node of the first inverting amplification circuit. The second coupling circuit may be connected between an output node of the first inverting amplification circuit and an input node of the second inverting amplification circuit. The feedback circuit may amplify the input node of the first inverting amplification circuit with a rail-to-rail voltage corresponding to a power supply voltage or a ground voltage based on the comparison result signal during the sampling period.

According to example embodiments, a comparator circuit includes an input circuit configured to generate a positive amplified input signal through a positive sampling node and generate a negative amplified input signal through a negative sampling node by alternately selecting a positive input voltage and a negative input voltage during an equalizing period and a sampling period, a first positive coupling capacitor connected between the positive sampling node and a first positive node, a first negative coupling capacitor connected between the negative sampling node and a first negative node, a first positive inverter connected between the first positive node and a second positive node, a first negative inverter connected between the first negative node and a second negative node, a first positive equalization switch configured to electrically connect the first positive node and the second positive node based on an equalization signal having an activation period corresponding to the equalizing period, a first negative equalization switch configured to electrically connect the first negative node and the second negative node based on the equalization signal, a second positive coupling capacitor connected between the second positive node and a third positive node, a second negative coupling capacitor connected between the second negative node and a third negative node, a second positive inverter connected between the third positive node and a fourth positive node, a second negative inverter connected between the third negative node and a fourth negative node, a second positive equalization switch configured to electrically connect the third positive node and a fourth positive node based on the equalization signal, a second negative equalization switch configured to electrically connect the third negative node and a fourth negative node based on the equalization signal, a first latching switch configured to electrically connect the fourth positive node and the third negative node based on a latch signal that is activated during the sampling period, a second latching switch configured to electrically connect the fourth negative node and the third positive node based on the latch signal, a positive feedback switch configured to electrically connect the fourth positive node and the first positive node based on the latch signal, and a negative feedback switch configured to electrically connect the fourth negative node and the first negative node.

According to example embodiments, a comparator circuit includes an input circuit configured to generate an amplified input signal through a sampling node by alternately selecting a positive input voltage and a negative input voltage during an equalizing period and a sampling period, a first coupling capacitor connected between the sampling node and a first node, a first inverter connected between the first node and a second node, a first equalization switch configured to electrically connect the first node and the second node based on an equalization signal having an activation period corresponding to the equalizing period, a second coupling capacitor connected between the second node and a third node, a second inverter connected between the third node and a fourth node, a second equalization switch configured to electrically connect the third node and the fourth node, a feedback switch configured to electrically connect the fourth node and the first node based on a latch signal that is activated during the sampling period.

The comparator circuit according to example embodiments may reduce the operation current of the first inverting amplification circuit by amplifying the input node of the first inverting amplification circuit with the rail-to-rail voltage during the sampling period using the feedback circuit. Through reduction of the operation current, the power consumption of the comparator circuit, various semiconductor devices and integrated circuits including the comparator circuit may be reduced.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
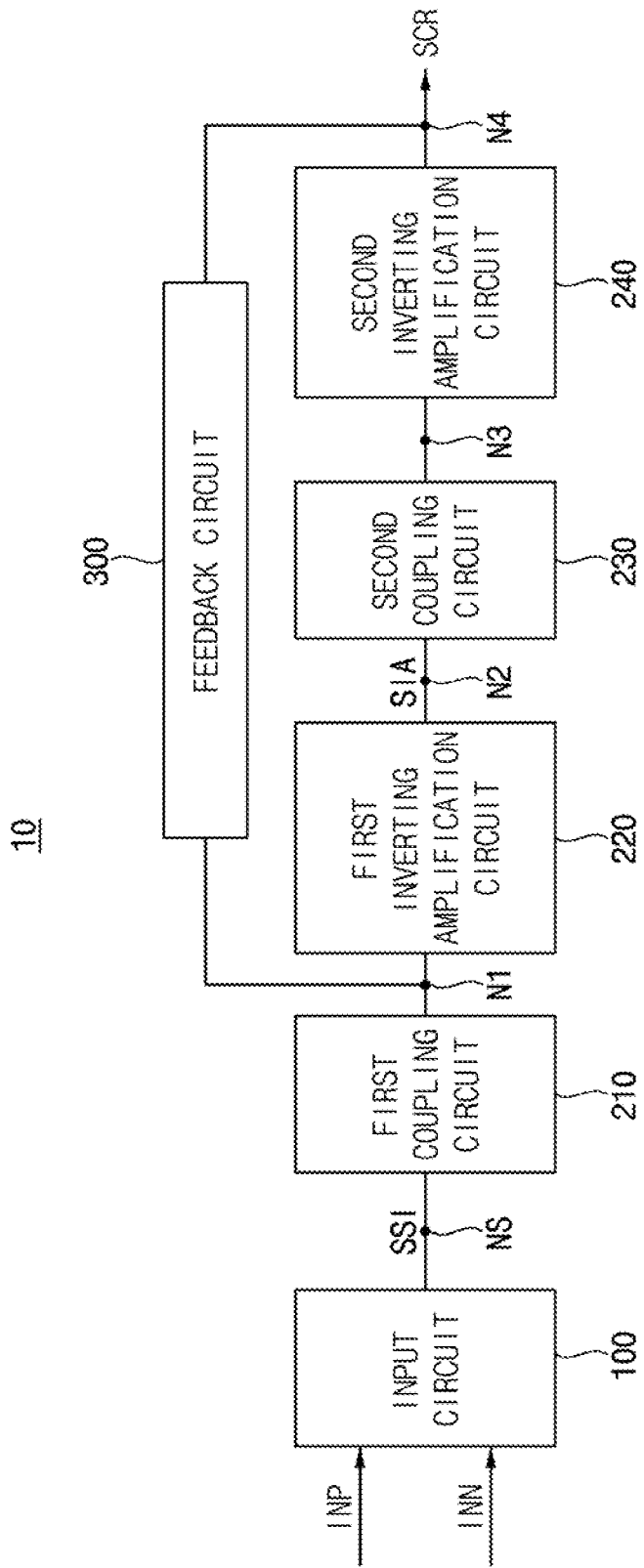
FIG. 1 is a block diagram illustrating a comparator circuit according to example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

FIG. 1 is a block diagram illustrating a comparator circuit according to example embodiments.

Referring to FIG. 1, a comparator circuit 10 may include an input circuit 100, a first coupling circuit 210, a first inverting amplification circuit 220, a second coupling circuit 230, a second inverting amplification circuit 240, and a feedback circuit 300. The comparator circuit 10 may be configured as a chopper type comparator.

The input circuit 100 may generate an amplified input signal SSI through a sampling node NS by alternately selecting a positive input voltage INP and a negative input voltage INN during an equalizing period and a sampling period.

The first coupling circuit 210 may be connected between the sampling node NS and a first node N1 corresponding to an input node of the first inverting amplification circuit 220. In other words, the first coupling circuit 210 may be connected between the input circuit 100 and the input node N1 of the first inverting amplification circuit 220. As will be described below, the first coupling circuit 210 may include at least one coupling capacitor.

The first inverting amplification circuit 220 may be connected between the first node N1 and a second node N2 corresponding to an output node of the first inverting amplification circuit 220. The first inverting amplification circuit 220 may generate an intermediate amplified signal SIA by performing an inversion and amplification operation based on the amplified input signal SSI during the sampling period. As will be described below, the first inverting amplification circuit 220 may include at least one inverter and at least one equalization switch.

The second coupling circuit 230 may be connected between the second node N2 and a third node N3 corresponding to an input node of the second inverting amplification circuit 240. In other words, the second coupling circuit 230 may be connected between the output node N2 of the first inverting amplification circuit 220 and the input node N3 of the second inverting amplification circuit 240. As will be described below, the second coupling circuit 230 may include at least one coupling capacitor.

The second inverting amplification circuit 240 may be connected between the third node N3 and a fourth node N4 corresponding to an output node of the second inverting amplification circuit 240. The second inverting amplification circuit 240 may generate a comparison result signal SCR by performing an inversion and amplification operation based on the intermediate amplified signal SIA during the sampling period. As will be described below, the second inverting amplification circuit 240 may include at least one inverter and at least one equalization switch.

The feedback circuit 300 may amplify the input node N1 of the first inverting amplification circuit 220 with a rail-to-rail voltage corresponding to a power supply voltage or a ground voltage based on the comparison result signal SCR during the sampling period.

In some example embodiments, as will be described below with reference to FIGS. 2, 10, 11, 12, and 13, the comparator circuit 10 may have a differential structure. In this case, each of the amplified input signal SSI, the intermediate amplified signal SIA, and the comparison result signal SCR may correspond to a differential signal pair of a positive signal and a negative signal, and each of the nodes NS, N1, N2, N3, and N4 may correspond to a differential node pair of a positive node and a negative node.

In some example embodiments, as will be described below with reference to FIGS. 14, 14, 16, and 17, the comparator circuit 10 may have a single-ended structure. In this case, each of the amplified input signal SSI, the intermediate amplified signal SIA, and the comparison result signal SCR may correspond to one of a positive signal and a negative signal, and each of the nodes NS, N1, N2, N3, and N4 may correspond to one of a positive node and a negative node.

As shown in FIG. 1, an operation current of the first inverting amplification circuit 220 may be reduced by amplifying the input node N1 of the first inverting amplification circuit 220 with the rail-to-rail voltage using the feedback circuit 300.

Figure 2:
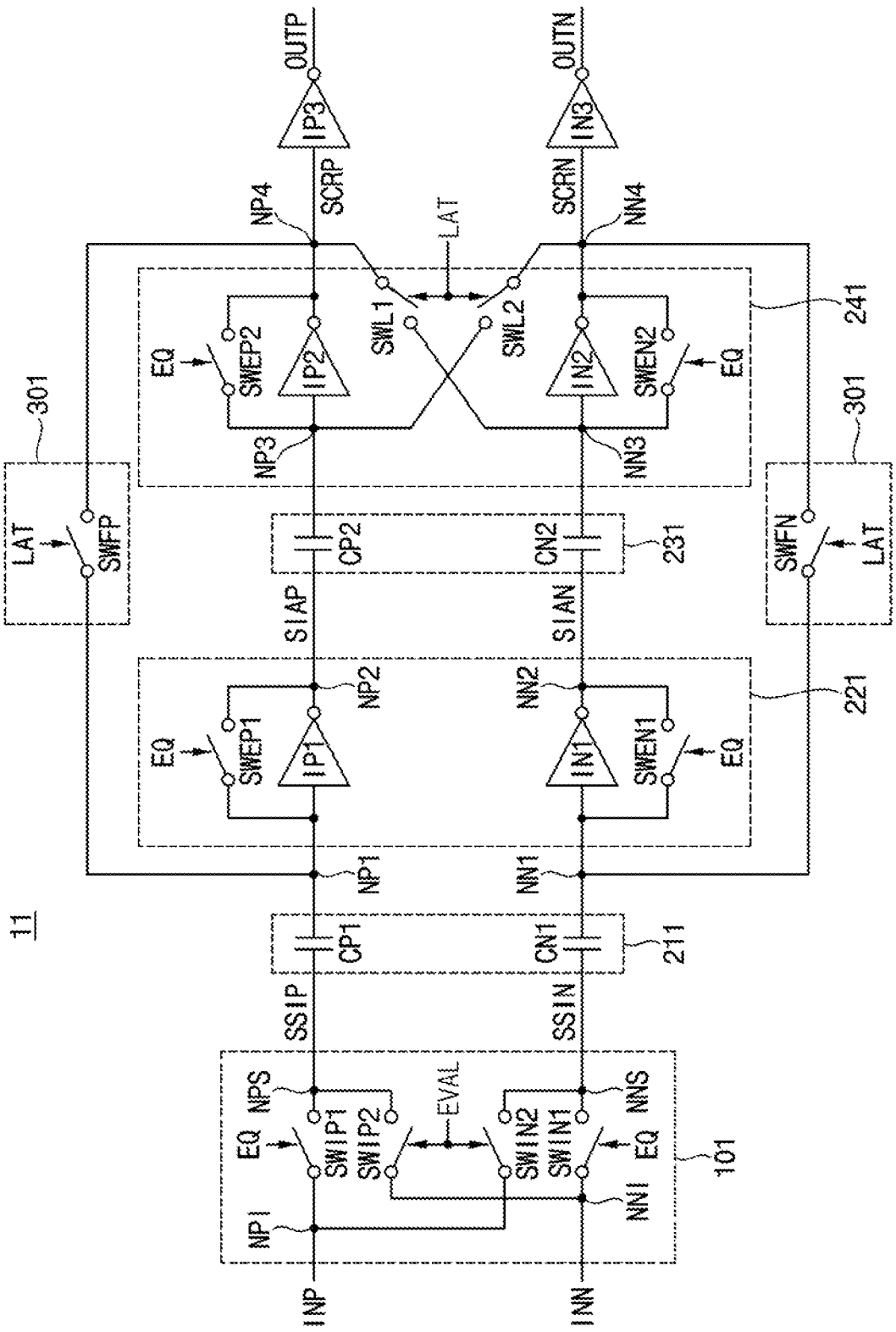
FIG. 2 is a circuit diagram illustrating an example configuration of a comparator circuit according to example embodiments.

FIG. 2 is a circuit diagram illustrating an example configuration of a comparator circuit. FIG. 2 illustrates an exemplary chopper type comparator circuit having a differential structure.

Referring to FIG. 2, a comparator circuit 11 may include an input circuit 101, a first coupling circuit 211, a first inverting amplification circuit 221, a second coupling circuit 231, a second inverting amplification circuit 241, and a feedback circuit 301.

The input circuit 101 may include a first positive input switch SWIP1, a second positive input switch SWIP2, a first negative input switch SWIN1, and a second negative input switch SWIN2.

The first positive input switch SWIP1 may electrically connect a positive input node NPI receiving the positive input voltage INP and a positive sampling node NPS outputting a positive amplified input signal SSIP based on an equalization signal EQ having an activation period corresponding to the equalizing period.

The second positive input switch SWIP2 may electrically connect a negative input node NNI receiving the negative input voltage INN and the positive sampling node NPS based on a sampling signal EVAL having an activation period corresponding to the sampling period.

The first negative input switch SWIN1 may electrically connect the negative input node NNI and a negative sampling node NNS outputting a negative amplified input signal SSIN based on the equalization signal EQ.

The second negative input switch SWIN2 may electrically connect the positive input node NPI and the negative sampling node NNS based on the sampling signal EVAL.

FIG. 2 illustrates a non-limiting example embodiment in which the first positive input switch SWIP1 and the first negative input switch SWIN1 operate based on the equalization signal EQ, and the second positive input switch SWIP2 and the second negative input switch SWIN2 operate based on the sampling signal EVAL. In alternate example embodiments, the first positive input switch SWIP1 and the first negative input switch SWIN1 may operate based on the sampling signal EVAL, and the second positive input switch SWIP2 and the second negative input switch SWIN2 may operate based on the equalization signal EQ.

The first coupling circuit 211 may include a first positive coupling capacitor CP1 and a first negative coupling capacitor CN1. The first positive coupling capacitor CP1 may be connected between the positive sampling node NPS of the input circuit 101 and a first positive node NP1 corresponding to a first input node of the first inverting amplification circuit 221. The first negative coupling capacitor CN1 may be connected between the negative sampling node NNS of the input circuit 101 and a first negative node NN1 corresponding to a second input node of the first inverting amplification circuit 221.

The first inverting amplification circuit 221 may include a first positive inverter IP1, a first negative inverter IN1, a first positive equalization switch SWEP1, and a first negative equalization switch SWEN1.

The first positive inverter IP1 may be connected between the first positive node NP1 corresponding to the first input node of the first inverting amplification circuit 221 and a second positive node NP2 corresponding to a first output node of the first inverting amplification circuit 221. The first negative inverter IN1 may be connected between the first negative node NN1 corresponding to a second input node of the first inverting amplification circuit 221 and a second negative node NN2 corresponding to a second output node of the first inverting amplification circuit 221.

The first positive equalization switch SWEP1 may electrically connect the first positive node NP1 corresponding to the input node of the first positive inverter IP1 and the second positive node NP2 corresponding to the output node of the first positive inverter IP1 based on the equalization signal EQ having an activation period corresponding to the equalizing period. The first negative equalization switch SWEN1 may electrically connect the first negative node NN1 corresponding to the input node of the first negative inverter IN1 and the second negative node NN2 corresponding to the output node of the first negative inverter IN1 based on the equalization signal EQ. The operation of connecting the input and output of an inverter may be referred to as an equalization operation or an auto-zero operation. The equalization operations will be further described below with reference to FIGS. 6 and 7.

The second coupling circuit 231 may include a second positive coupling capacitor CP2 and a second negative coupling capacitor CN2. The second positive coupling capacitor CP2 may be connected between the second positive node NP2 and a third positive node NP3 corresponding a first input node of the second inverting amplification circuit 241. The second negative coupling capacitor CN2 may be connected between the second negative node NN2 and a third negative node NN3 corresponding to a second input node of the second inverting amplification circuit 241.

The second inverting amplification circuit 241 may include a second positive inverter IP2, a second negative inverter IN2, a second positive equalization switch SWEP2, and a second negative equalization switch SWEN2.

The second positive inverter IP2 may be connected between the third positive node NP3 corresponding the first input node of the second inverting amplification circuit 241 and a fourth positive node NP4 corresponding to a first output node of the second inverting amplification circuit 241, where the fourth positive node NP4 generates the positive comparison result signal SCRP. The second negative inverter IN2 may be connected between the third negative node NN3 corresponding to the second input node of the second inverting amplification circuit 241 and a fourth negative node NN4 corresponding to a second output node of the second inverting amplification circuit 241, where the fourth negative node NN4 generates the negative comparison result signal SCRN.

The second positive equalization switch SWEP2 may electrically connect the third positive node NP3 corresponding to the input node of the second positive inverter IP2 and the fourth positive node NP4 corresponding to the output node of the second positive inverter IP2 based on the equalization signal EQ. The second negative equalization switch SWEN2 may electrically connect the third negative node NN3 corresponding to the input node of the second negative inverter IN2 and the fourth negative node NN4 corresponding to the output node of the second negative inverter IN2 based on the equalization signal EQ.

In some example embodiments, the second inverting amplification circuit 241 may further include a first latching switch SWL1 and a second latching switch SWL2.

The first latching switch SWL1 may electrically connect the fourth positive node NP4 corresponding to the output node of the second positive inverter IP2 and the third negative node NN3 corresponding to the input node of the second negative inverter IN2 based on a latch signal LAT that is activated during the sampling period. The second latching switch SWL2 may electrically connect the fourth negative node NN4 corresponding to the output node of the second negative inverter IN2 and the third positive node NP3 corresponding to the input node of the first positive inverter IP2 based on the latch signal LAT. As a result, the second positive inverter IP2 and the second negative inverter IN2 may form a latch during the activation period of the latch signal LAT.

In some example embodiments, the comparator circuit 11 may further include a third positive inverter IP3 and a third negative inverter IN3.

The third positive inverter IP3 may be connected between the fourth positive node NP4 and a positive output node. The third positive inverter IP3 may generate a positive output signal OUTP through the positive output node by performing an inversion and amplification operation based on the positive comparison result signal SCRP. The third negative inverter IN3 may be connected between the fourth negative node NN4 and a negative output node. The third negative inverter IN3 may generate a negative output signal OUTN through the negative output node by performing an inversion and amplification operation based on the negative comparison result signal SCRN.

The feedback circuit 301 may include a positive feedback switch SWFP and a negative feedback switch SWFN.

The positive feedback switch SWFP may electrically connect the fourth positive node NP4 corresponding to the first output node of the second inverting amplification circuit 241 and the first positive node NP1 corresponding to the first input node of the first inverting amplification circuit 221 based on the latch signal LAT that is activated during the sampling period. The negative feedback switch SWFN may electrically connect the fourth negative node NN4 corresponding to the second output node of the second inverting amplification circuit 241 and the first negative node NN1 corresponding to the second input node of the first inverting amplification circuit 221 based on the latch signal LAT.

As described above, during the activation period of the latch signal LAT, the second positive inverter IP2 and the second negative inverter IN2 may form a latch, and each of the positive comparison result signal SCRP and the negative comparison result signal SCRN may have the rail-to-rail voltage corresponding to the power supply voltage or the ground voltage. When the positive comparison result signal SCRP is the power supply voltage, the negative comparison result signal SCRN is the ground voltage. In contrast, when the positive comparison result signal SCRP is the ground voltage, the negative comparison result signal SCRN is the power supply voltage. As the result, the first positive node NP1 and the first negative node NN1 corresponding to the input nodes of the first inverting amplification circuit 221 may be amplified with the rail-to-rail voltage using the feedback circuit 301.

Figure 3:
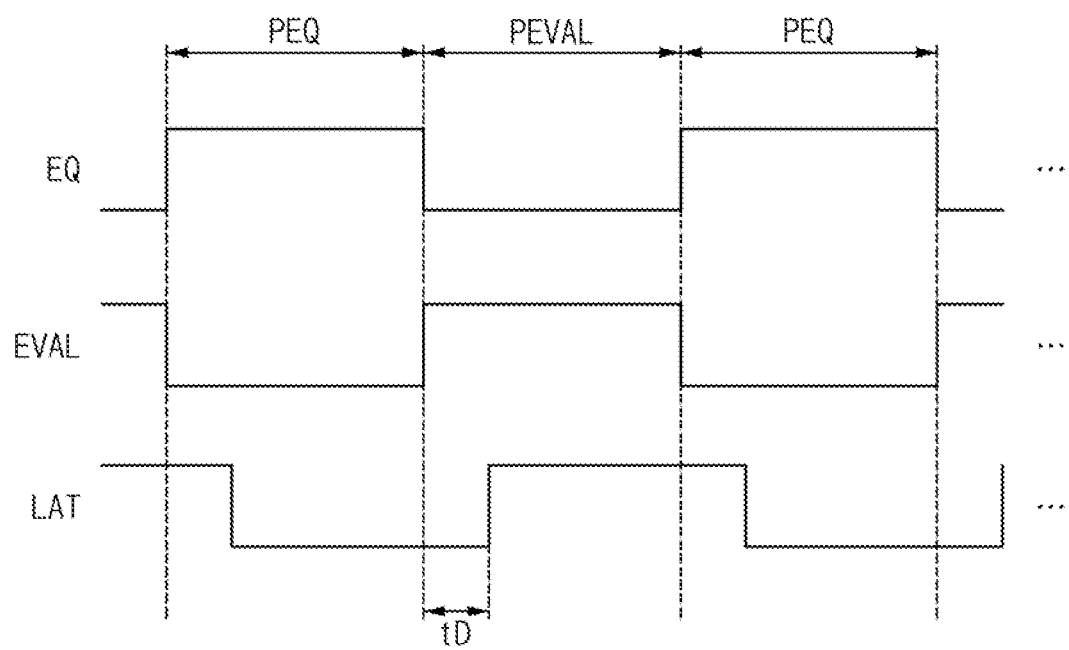
FIGS. 3, 4, and 5 are timing diagrams illustrating example embodiments of timing control signals of a comparator circuit.
Figure 4:
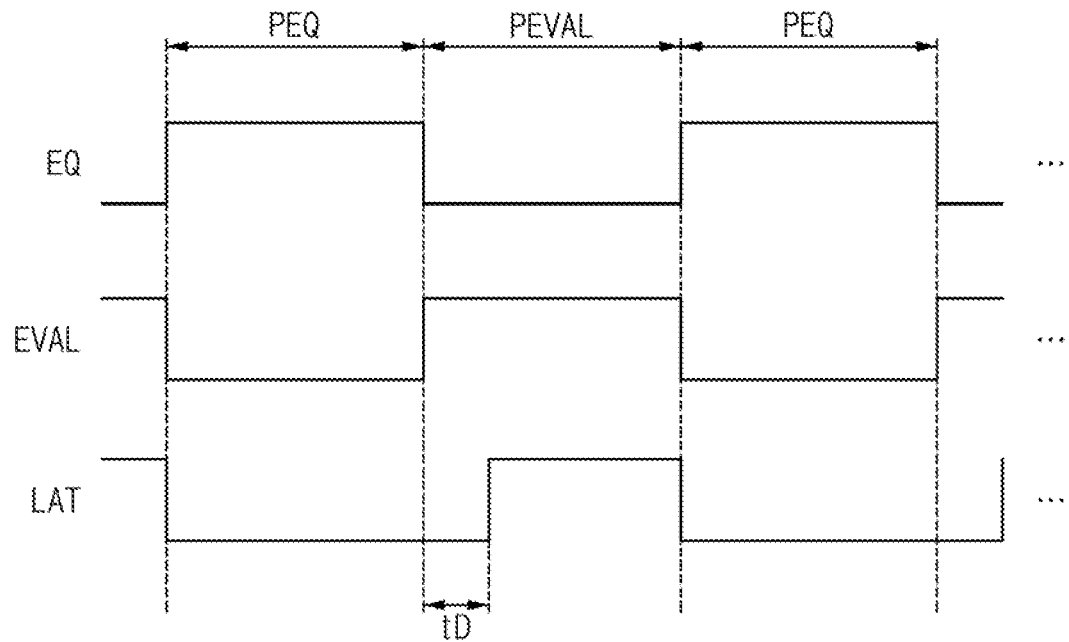
Figure 5:
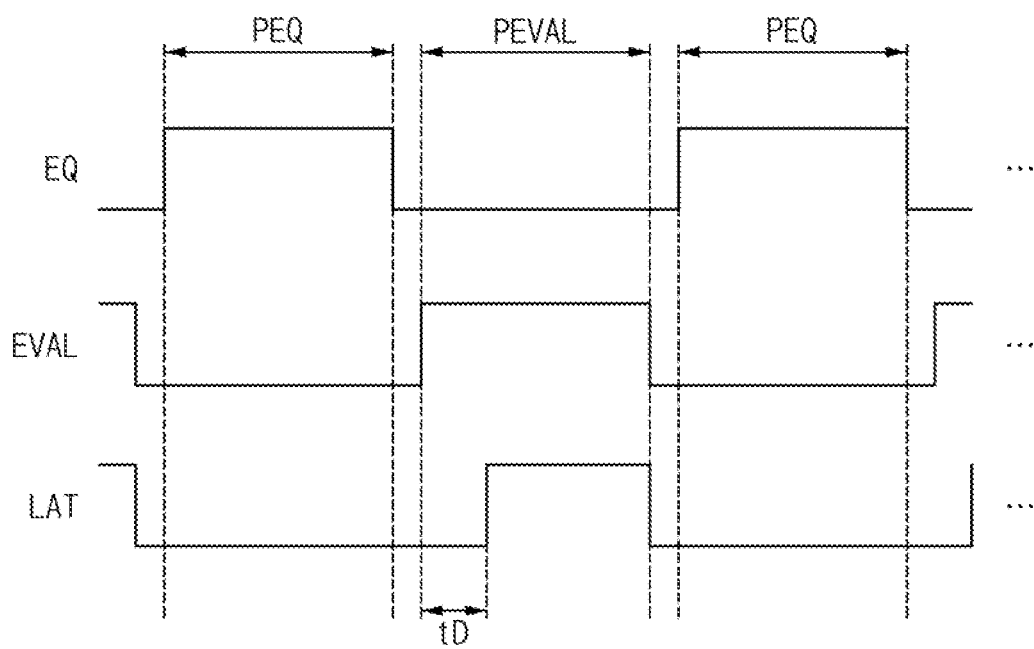

FIGS. 3, 4, and 5 are timing diagrams illustrating example embodiments of timing control signals of a comparator circuit. FIGS. 3, 4, and 5 illustrate example timings of the equalization signal EQ, the sampling signal EVAL, and the latch signal LAT described with reference to FIG. 2.

Referring to FIGS. 2 through 5, the input circuit 101 may generate the amplified input signals SSIP and SSIN based on the equalization signal EQ having an activation period corresponding to an equalizing period PEQ and the sampling signal EVAL having an activation period corresponding to a sampling period PEVAL.

The first inverting amplification circuit 221 and the second inverting amplification circuit 241 may perform the equalization operation to electrically connect the input and output of each of the inverters IP1, IP2, IP3, and IP4 in the first inverting amplification circuit 221 and the second inverting amplification circuit 241 during the equalizing period PEQ based on the equalization signal EQ.

The feedback circuit 301 may amplify the input nodes NP1 and NN1 of the first inverting amplification circuit 221 based on the latch signal LAT that is activated during the sampling period PEVAL.

In some example embodiments, as illustrated in FIGS. 3 and 4, the equalization signal EQ and the sampling signal EVAL may be complementary to each other. In some example embodiments, as illustrated in FIG. 5, a gap or a dead time may be implemented between the activation period of the equalization signal EQ and the activation period of the sampling signal EVAL to reduce errors of the sampling operation.

In some example embodiments, as illustrated in FIG. 3, the latch signal LAT may be a delayed copy of the sampling signal EVAL, delayed by a predetermined delay time tD. In some example embodiments, as illustrated in FIGS. 4 and 5, the latch signal LAT may be activated after the delay time tD from an activation time point of the sampling signal EVAL and the latch signal LAT may be deactivated at a deactivation time point of the sampling signal EVAL.

FIGS. 3, 4, and 5 illustrate non-limiting example embodiments in which the equalization signal EQ, the sampling signal EVAL and the latch signal LAT are activated periodically. In some example embodiments, the equalization signal EQ, the sampling signal EVAL, and the latch signal LAT may be activated non-periodically whenever the comparison result of the comparator circuit is required.

Figure 6:
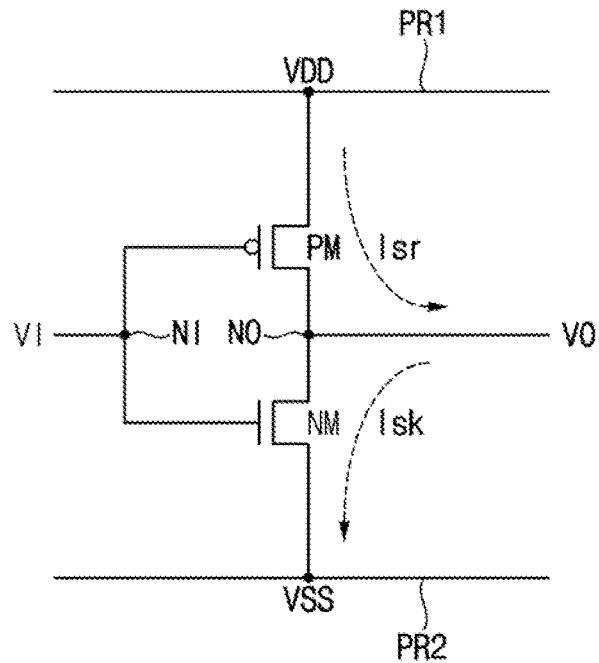
FIG. 6 is a diagram illustrating an example embodiment of an inverter included in a comparator circuit.
Figure 7:
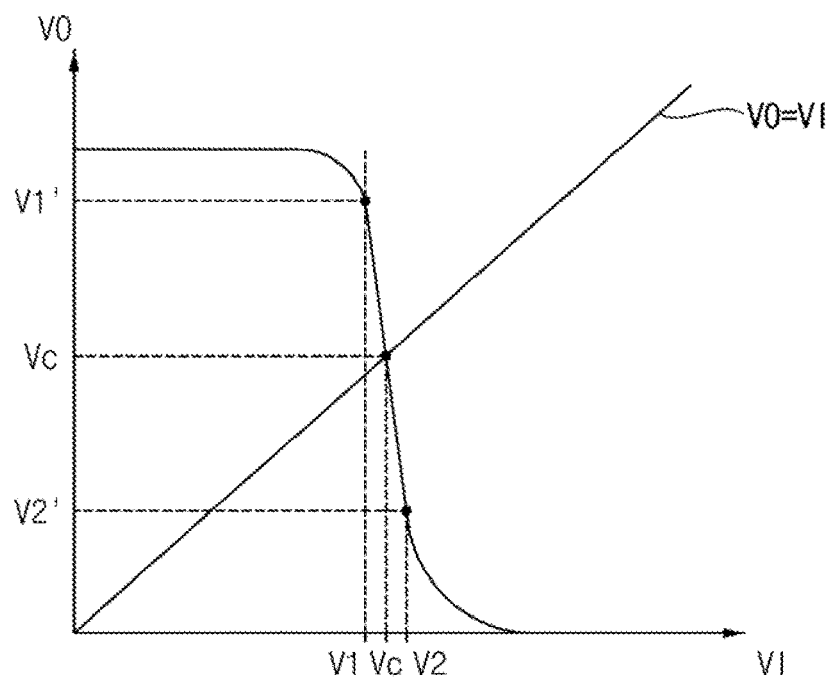
FIG. 7 is a diagram illustrating operation characteristic of the invert of FIG. 6 according to example embodiments.

FIG. 6 is a diagram illustrating an example embodiment of an inverter included in a comparator circuit, and FIG. 7 is a diagram illustrating operation characteristic of the inverter of FIG. 6. The inverters IP1, IP2, IP3, IN1, IN2, and IN3 in the comparator circuit 11 of FIG. 2 may have the configuration of FIG. 6, but example embodiments are not limited thereto.

Referring to FIG. 6, the inverter may include one P-type transistor PM and one N-type transistor NM. The P-type transistor PM may be connected between an output node NO and a first power rail PR1 to which the power supply voltage VDD is applied, and the N-type transistor NM may be connected between the output node NO and a second power rail PR2 to which the ground voltage VSS is applied.

The inverter receives an input voltage VI through an input node NI to which the gate electrodes of the P-type transistor PM and the N-type transistor NM are connected commonly. The inverter may perform the inversion and amplification operation based on the input voltage VI to generate an output voltage VO through the output node NO.

The output voltage VO may be pulled up by a sourcing current Isr when the P-type transistor PM is turned on and may be pulled down by a sinking current Isk when the N-type transistor NM is turned on.

Referring to FIGS. 6 and 7, the input voltage VI and the output voltage VO become the same as the logic threshold voltage Vc when the input node NI and the output node NO are electrically connected to each other. The output voltage VO increases to a first output voltage V1' when the input voltage VI is decreased from the logic threshold voltage Vc to a first input voltage V1, and the output voltage VO decreases to a second output voltage V2' when the input voltage VI is increased from the logic threshold voltage Vc to a second input voltage V2.

As illustrated in FIG. 7, the output voltage VO varies by a relatively large amount even though the input voltage VI varies by a relatively small amount. The comparator circuit 11 of FIG. 2 according to example embodiments may perform the comparison operation exactly using the equalization switches even though the voltage difference between the positive input voltage INP and the negative input voltage INN is small.

As the input voltage VI approaches the rail-to-rail voltage corresponding to the power supply voltage VDD or the ground voltage VSS, only one of the P-type transistor PM and the N-type transistor NM may be turned on and thus the output voltage VO may approach the rail-to-rail voltage. After the output voltage VO attains the rail-to-rail voltage, the sourcing current Isr and the sinking current Isk may be zero and the inverter may not consume power. According to example embodiments, the operation current of the first inverting amplification circuit 221 may be reduced by amplifying the input nodes NP1 and NN1 of the first inverting amplification circuit 221 with the rail-to-rail voltage during the sampling period PEVAL using the feedback circuit 301. Through reduction of the operation current, the power consumption of the comparator circuit 11 may be reduced.

Figure 8:
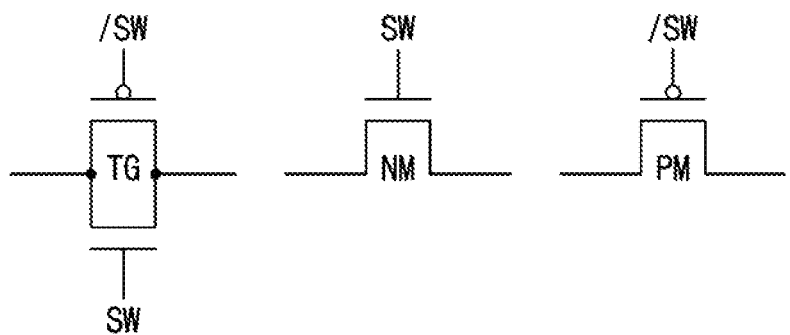
FIG. 8 is a diagram illustrating example embodiments of a switch included in a comparator circuit.

FIG. 8 is a diagram illustrating example embodiments of a switch included in a comparator circuit according to example embodiments. The switches SWIP1, SWIP2, SWIN1, SWIN2, SWEP1, SWEP2, SWEN1, SWEN2, SWL1, SWL2, SWFP, and SWFN may have the configuration of FIG. 8, but example embodiments are not limited thereto.

According to example embodiments, the switch may be implemented with a transmission gate TG, an N-type transistor NM, or a P-type transistor PM. In FIG. 8, a switch signal SW indicates the corresponding signal to each switch in FIG. 2, and an inverted switch signal/SW is a signal that may be generate by inverting the switch signal SW. The transmission gate TG and the N-type transistor NM may be turned on while the switch signal SW is activated in the logic high level, and the P-type transistor PM may be turned on the inverted switch signal/SW is activated in the logic low level.

Figure 9:
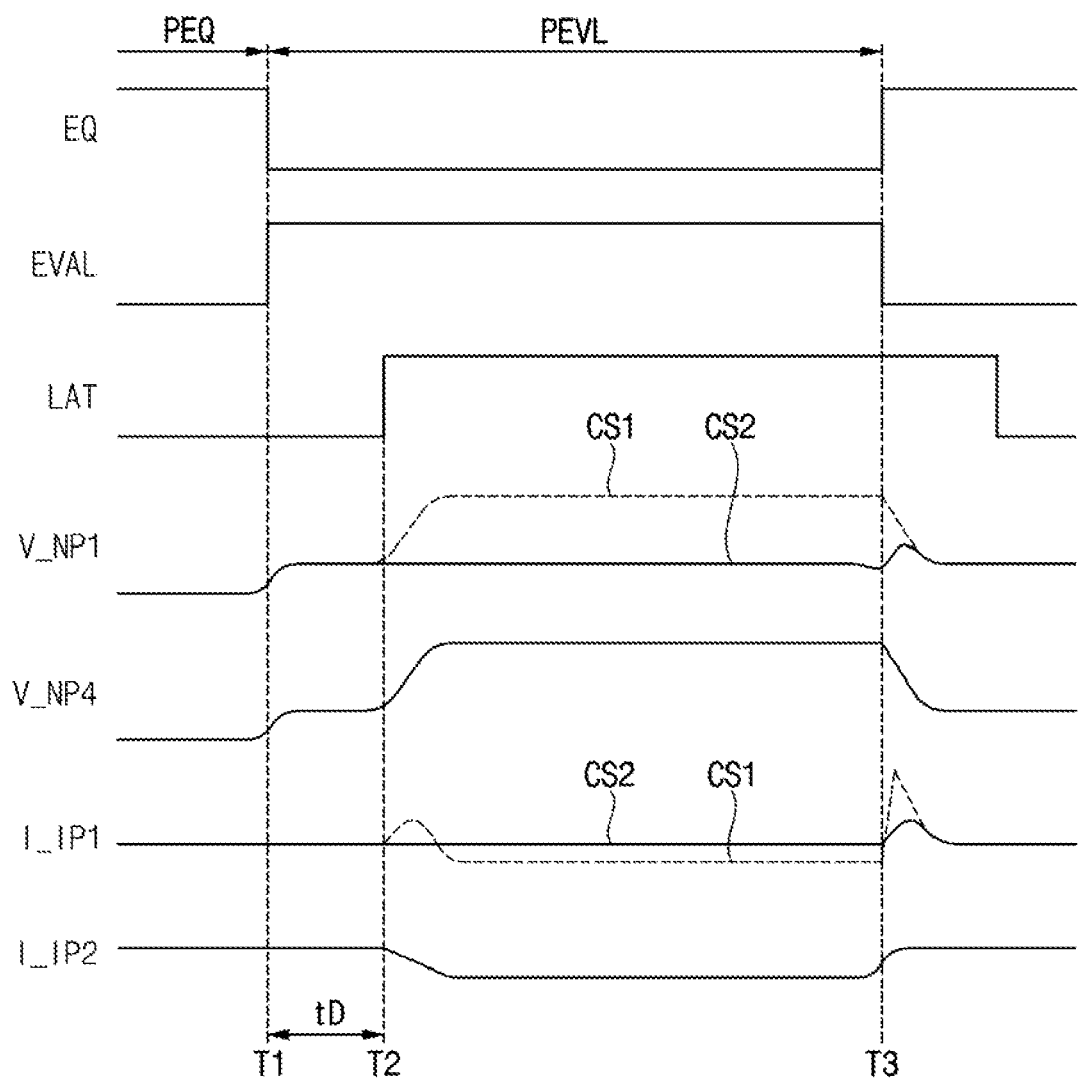
FIG. 9 is a diagram for describing power consumption of a comparator circuit according to example embodiments.

FIG. 9 is a diagram for describing power consumption of a comparator circuit according to example embodiments.

FIG. 9 illustrates a simulation result of applying the equalization signal EQ, the sampling signal EVAL, and the latch signal LAT of FIG. 3 to the comparator circuit 11 of FIG. 2, with respect to one equalizing period PEQ and one sampling period PEVAL. FIG. 9 illustrates the simulated waveforms of the voltage V_NP1 of the first positive node NP1, the voltage V_NP4 of the fourth positive node NP4, the operation current I_IP1 of the first positive inverter NP1, and the operation current I_IP2 of the second positive inverter IP2, for example, when the power supply voltage VDD is about 1.1V, the ground voltage VSS is about 0V, the positive input voltage INP is about 500 mV, and the negative input voltage INN is about 517 mV. The first case CS1 indicates a case when the feedback circuit 301 is enabled, and the second case CS2 indicates a case when the feedback circuit 301 is disabled.

When the latch signal LAT is activated during the sampling period PEVAL, the voltage V_NP4 of the fourth positive node NP may be maintained with the rail-to-rail voltage of about 1.1V. The operation current I_IP2 of the second positive inverter IP2 may be maintained with about 4.23 μA (micro Amperes) in the first case CS1 and with about 4.41 μA in the second case CS2.

The voltage V_VP1 of the first positive node NP1 is maintained with about 517 mV in the second case CS2 and with 1.1V in the first case CS1. As a result, the operation current I_IP1 of the first positive inverter NP1 is about 21.1 μA in the second case CS2, but the operation current I_IP1 may be significantly reduced to about 33.9 nA (nano Amperes) in the first case CS1.

As a result, the comparator circuit 11 according to example embodiments may reduce the operation current of the first inverting amplification circuit 221 by amplifying the input nodes NP1 and NN1 of the first inverting amplification circuit 221 with the rail-to-rail voltage during the sampling period PEVAL using the feedback circuit 301. Through reduction of the operation current, the power consumption of various semiconductor devices and integrated circuits including the comparator circuit 11 may be reduced.

FIGS. 10 through 17 are circuit diagrams illustrating example configurations of a comparator circuit according to example embodiments.

FIGS. 10 through 13 illustrate chopper type comparator circuits having a differential structure as the comparator circuit 11 of FIG. 2. Descriptions repeated with respect to FIG. 2 may be omitted, and example embodiments are described with respect to configurations of the feedback circuit.

Figure 10:
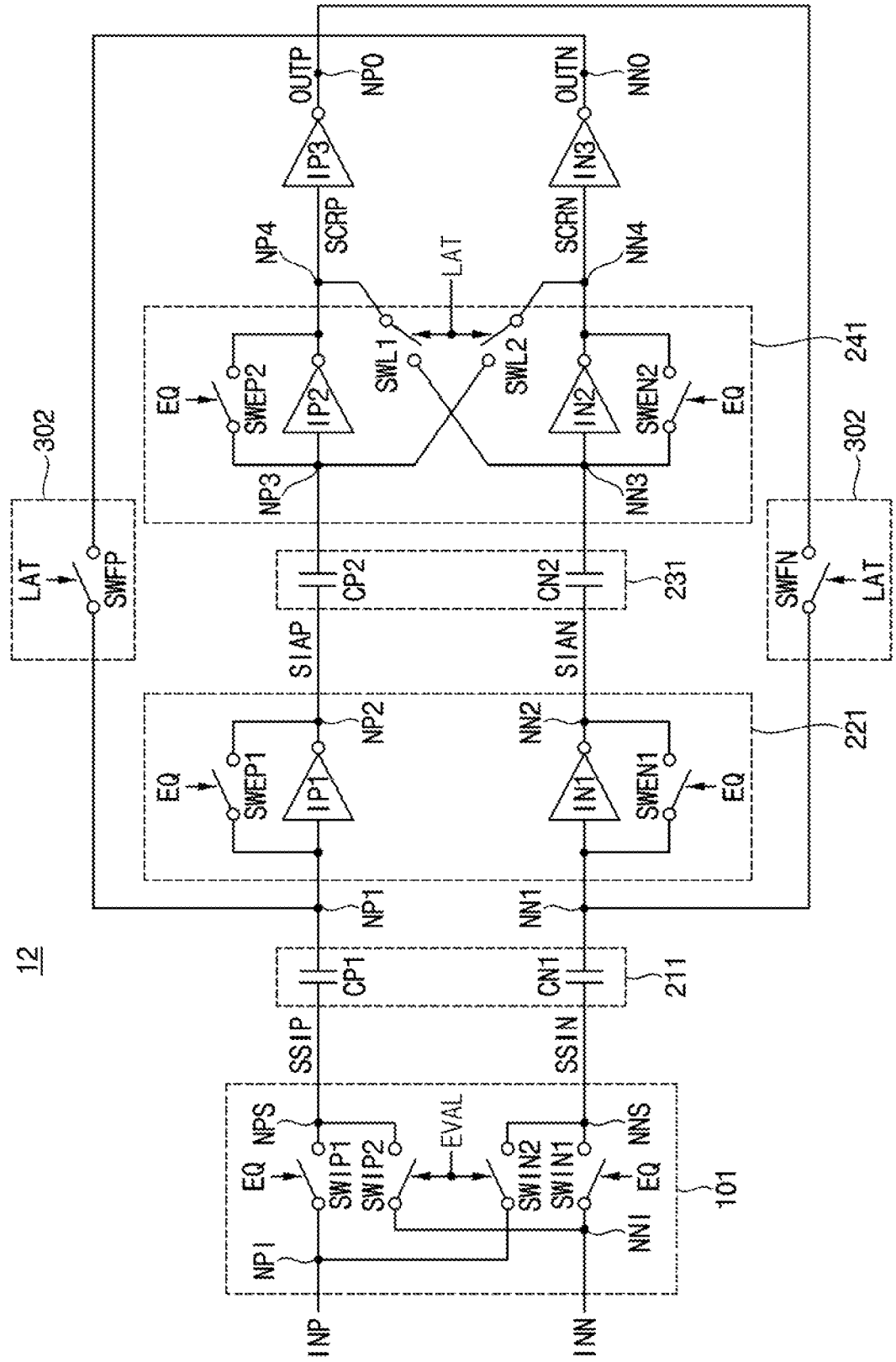
FIGS. 10 through 17 are circuit diagrams illustrating example configurations of a comparator circuit according to example embodiments.

Referring to FIG. 10, a comparator circuit 12 may include an input circuit 101, a first coupling circuit 211, a first inverting amplification circuit 221, a second coupling circuit 231, a second inverting amplification circuit 241, a feedback circuit 302, a third positive inverter IP3, and a third negative inverter IN3.

The third positive inverter IP3 may be connected between the fourth positive node NP4 and the positive output node NPO. The third positive inverter IP3 may generate the positive output signal OUTP through the positive output node NPO by performing an inversion and amplification operation based on the positive comparison result signal SCRP. The third negative inverter IN3 may be connected between the fourth negative node NN4 and a negative output node NNO. The third negative inverter IN3 may generate a negative output signal OUTN through the negative output node NNO by performing an inversion and amplification operation based on the negative comparison result signal SCRN.

The feedback circuit 302 may include a positive feedback switch SWFP and a negative feedback switch SWFN.

The positive feedback switch SWFP may electrically connect the negative output node NNO and the first positive node NP1 based on the latch signal LAT that is activated during the sampling period PEVAL. The negative feedback switch SWFN may electrically connect the positive output node NPO and the first negative node NN1 based on the latch signal LAT.

Figure 11:
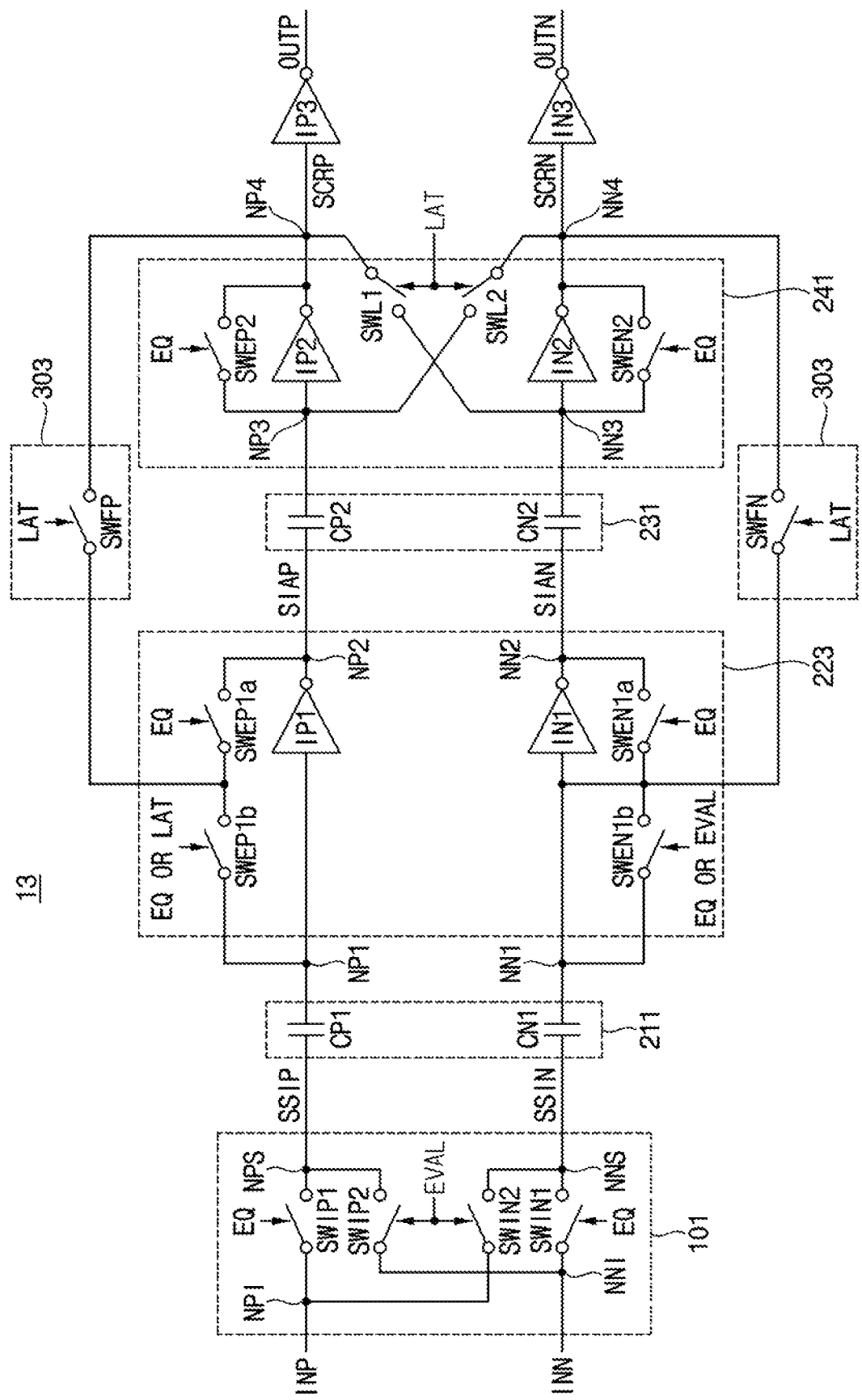

Referring to FIG. 11, a comparator circuit 13 may include an input circuit 101, a first coupling circuit 211, a first inverting amplification circuit 223, a second coupling circuit 231, a second inverting amplification circuit 241, a feedback circuit 303, a third positive inverter IP3 and a third negative inverter IN3.

The first inverting amplification circuit 223 in FIG. 11 may include a first positive equalization switch SWEP1a, a second positive equalization switch SWEP1b, a first negative equalization switch SWEN1a and a second negative equalization switch SWEN1b, whereas the first inverting amplification circuit 221 in FIG. 2 includes the first positive equalization switch SWEP1 and the first negative equalization switch SWEN1.

The first positive equalization switch SWEP1a may be connected in parallel with the first positive inverter IP1 between the first positive node NP1 corresponding to the first input node of the first inverting amplification circuit 223 and the second positive node NP2 corresponding to the first output node of the first inverting amplification circuit 223, and the first positive equalization switch SWEP1a may be turned on based on the equalization signal EQ having the activation period corresponding to the equalizing period PEQ. The second positive equalization switch SWEP1b may be connected in series with the first positive equalization switch SWEP1a between the first positive node NP1 and the second positive node NP2, and the second positive equalization switch SWEP1b may be turned on based on the equalization signal EQ or the latch signal LAT.

The first negative equalization switch SWEN1a may be connected in parallel with the first negative inverter IN1 between the first negative node NN1 corresponding to the second input node of the first inverting amplification circuit 223 and the second negative node NN2 corresponding to the second output node of the first inverting amplification circuit 223, and the first negative equalization switch SWEN1a may be turned on based on the equalization signal EQ. The second negative equalization switch SWEN1b may be connected in series with the first negative equalization switch SWEN1a between the first negative node NN1 and the second negative node NN2, and the second positive equalization switch SWEP1b may be turned on based on the equalization signal EQ or the latch signal LAT.

In the example embodiment of FIG. 11, the positive feedback switch SWFP may electrically connect the fourth positive node NP4 corresponding to the first output node of the second inverting amplification circuit 241 and a connection node of the first positive equalization switch SWEP1a and the second positive equalization switch SWEP1b based on the latch signal LAT. In addition, the negative feedback switch SWFN may electrically connect the negative positive node NN4 corresponding to the second output node of the second inverting amplification circuit 241 and a connection node of the first negative equalization switch SWEN1a and the second negative equalization switch SWEN1b based on the latch signal LAT.

Figure 12:
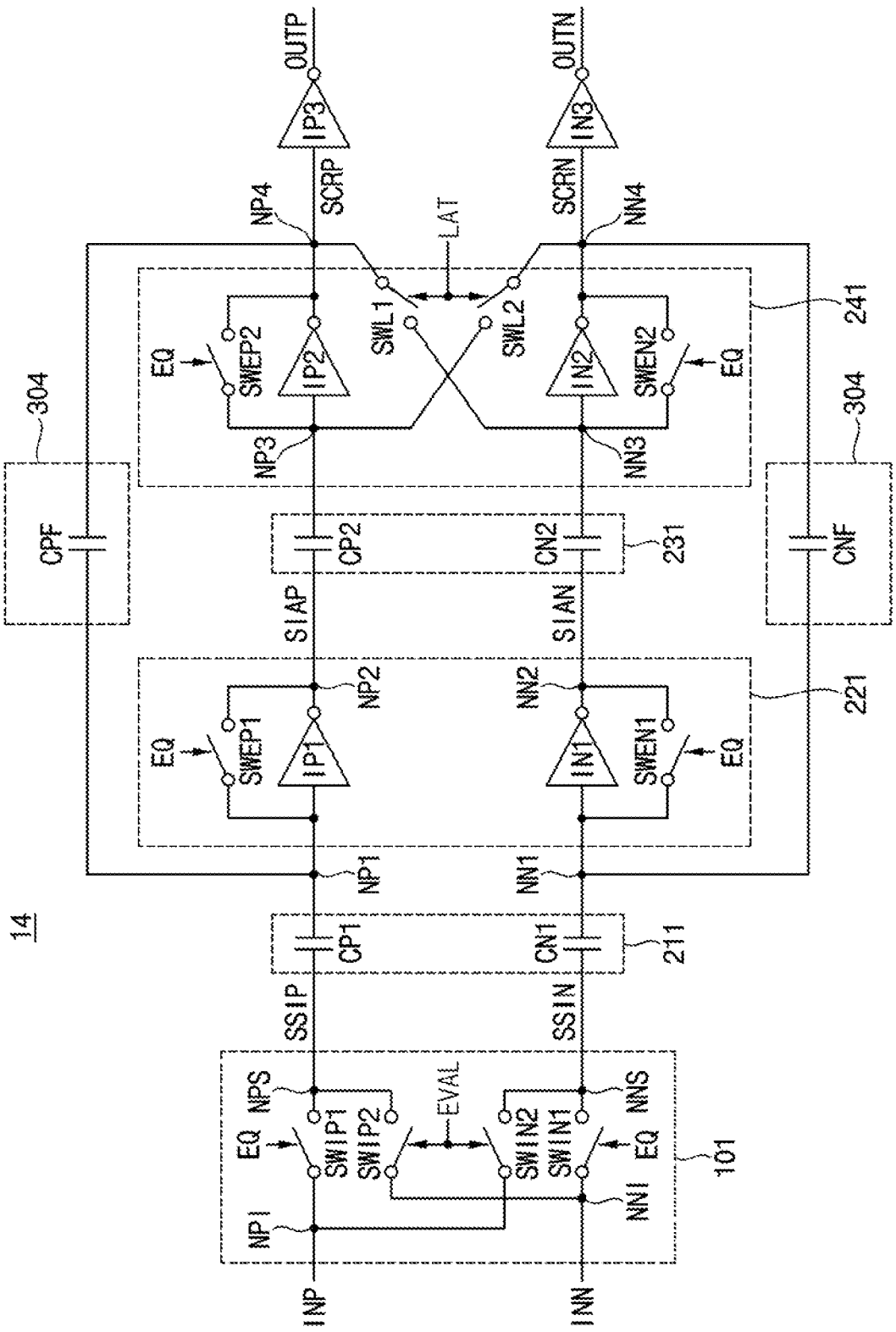

Referring to FIG. 12, a comparator circuit 14 may include an input circuit 101, a first coupling circuit 211, a first inverting amplification circuit 221, a second coupling circuit 231, a second inverting amplification circuit 241, a feedback circuit 304, a third positive inverter IP3 and a third negative inverter IN3.

The feedback circuit 304 may include a positive feedback capacitor CPF and a negative feedback capacitor CNF. The positive feedback capacitor CPF may be connected between the fourth positive node NP4 and the first positive node NP1. The negative feedback capacitor CNF may be connected between the fourth negative node NN4 and the first negative node NN1.

Figure 13:
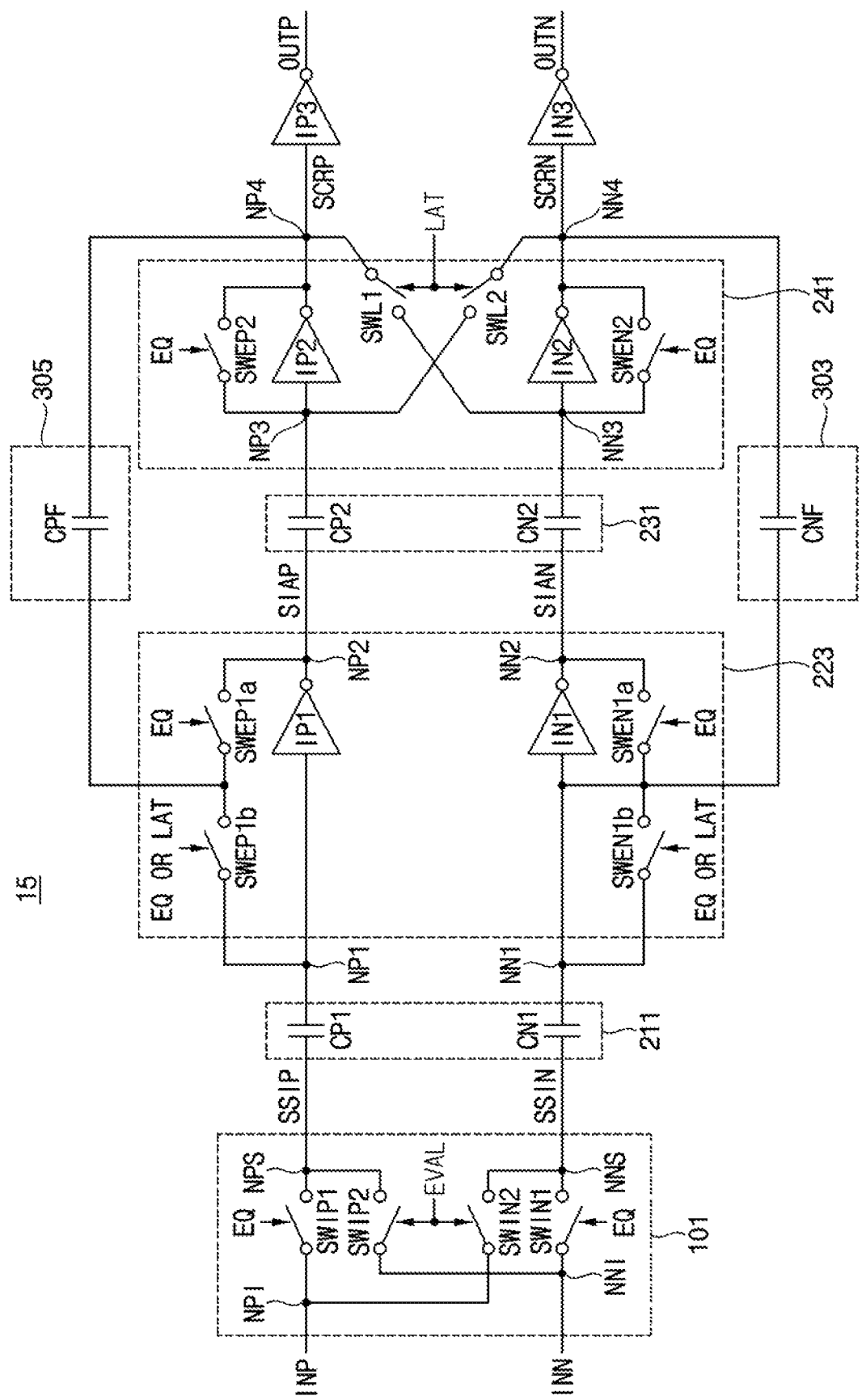

Referring to FIG. 13, a comparator circuit 15 may include an input circuit 101, a first coupling circuit 211, a first inverting amplification circuit 223, a second coupling circuit 231, a second inverting amplification circuit 241, a feedback circuit 305, a third positive inverter IP3 and a third negative inverter IN3.

The feedback circuit 305 of FIG. 13 has a configuration such that the positive feedback switch SWFP and the negative feedback switch SWFN in the feedback circuit 303 of FIG. 11 are replaced with the positive feedback capacitor CPF and the negative feedback capacitor CNF.

FIGS. 14 through 17 illustrated chopper type comparator circuits having a single-ended structure according to example embodiments.

Figure 14:
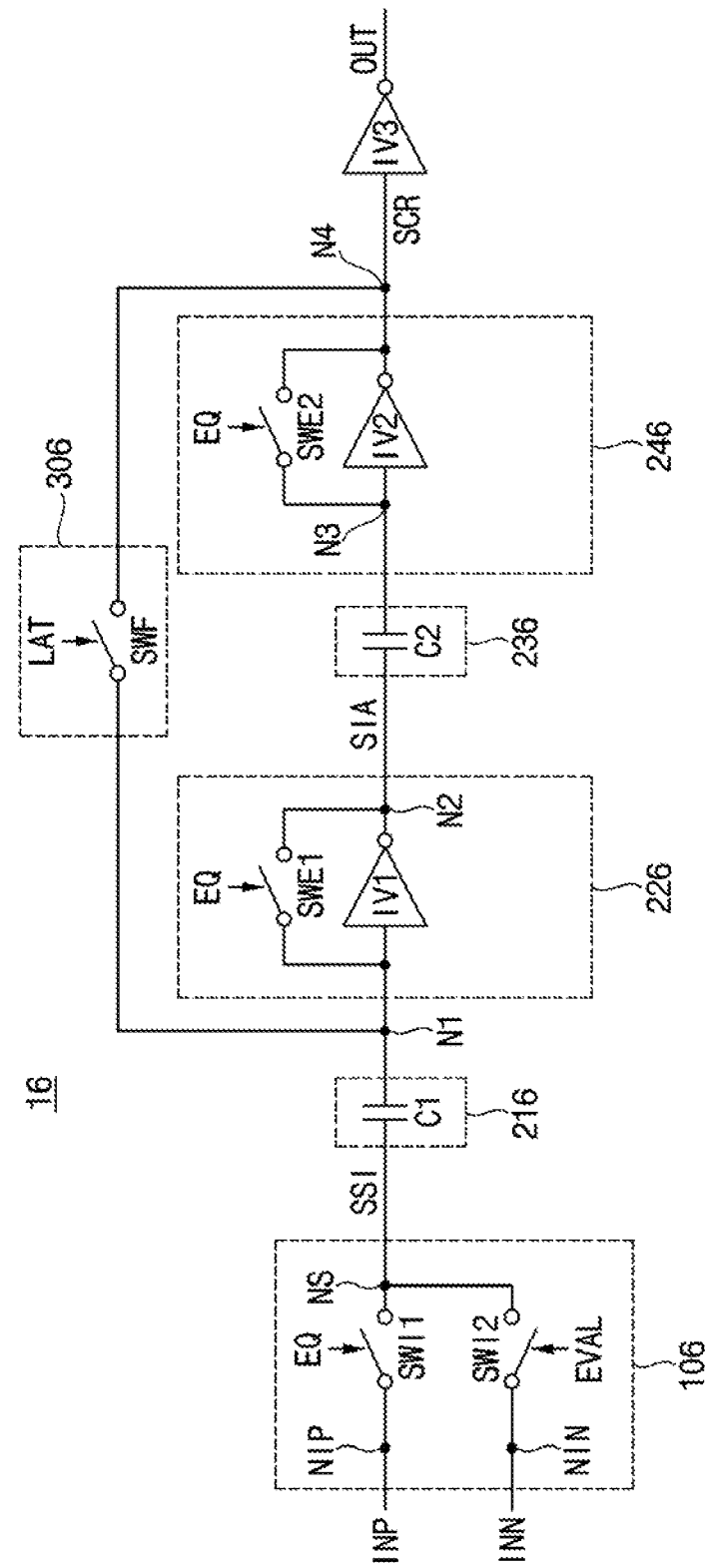

Referring to FIG. 14, a comparator circuit 16 may include an input circuit 106, a first coupling circuit 216, a first inverting amplification circuit 226, a second coupling circuit 236, a second inverting amplification circuit 246, a feedback circuit 306 and output inverter IV3.

The comparator circuit 16 having the single-ended structure of FIG. 14 corresponds to a portion of the comparator circuit 11 having the differential structure of FIG. 2. In other words, the comparator circuit 16 of FIG. 14 may correspond to the configuration of generating the positive output signal OUTP among the comparator circuit 11, or the configuration of generating the negative output signal OUTN among the comparator circuit 11.

The input circuit 106 may generate an amplified input signal SSI through a sampling node NS by alternately selecting a positive input voltage INP and a negative input voltage INN during an equalizing period and a sampling period.

The input circuit 106 may include a first input switch SWI1 and a second input switch SWI2. The first input switch SWI1 may electrically connect a positive input node NPI receiving the positive input voltage INP and the sampling node NS outputting an amplified input signal SSI based on an equalization signal EQ having an activation period corresponding to the equalizing period. The second input switch SWI2 may electrically connect a negative input node NNI receiving the negative input voltage INN and the sampling node NS based on the evaluation signal EVAL.

The first coupling circuit 216 may be connected between the sampling node NS and a first node N1 corresponding to an input node of the first inverting amplification circuit 226. In other words, the first coupling circuit 216 may be connected between the input circuit 106 and the input node N1 of the first inverting amplification circuit 226. The first coupling circuit 216 may include a first capacitor C1.

The first inverting amplification circuit 226 may be connected between a first node N1 corresponding to the input node of the first inverting amplification circuit 226 and a second node N2 corresponding to an output node of the first inverting amplification circuit 226. The first inverting amplification circuit 226 may generate an intermediate amplified signal SIA by performing an inversion and amplification operation based on the amplified input signal SSI during the sampling period.

The first inverting amplification circuit 226 may include a first inverter IV1 and a first equalization switch SWE1.

The first inverter IV1 may be connected between the first node N1 corresponding to the input node of the first inverting amplification circuit 226 and the second node N2 corresponding to the output node of the first inverting amplification circuit 226. The first equalization switch SWE1 may electrically connect the first node N1 and the second node N2 based on the equalization signal EQ.

The second coupling circuit 236 may be connected between the second node N2 and a third node N3 corresponding to an input node of the second inverting amplification circuit 246. In other words, the second coupling circuit 236 may be connected between the output node N2 of the first inverting amplification circuit 226 and the input node N3 of the second inverting amplification circuit 246. The second coupling circuit 236 may include a second capacitor C2.

The second inverting amplification circuit 246 may be connected between the third node N1 corresponding to an input node of the second inverting amplification circuit 246 and a fourth node N4 corresponding to an output node of the second inverting amplification circuit 246. The second inverting amplification circuit 246 may generate a comparison result signal SCR by performing an inversion and amplification operation based on the intermediate amplified signal SIA through the fourth node N4 during the sampling period.

The second inverting amplification circuit 246 may include a second inverter IV2 and a second equalization switch SWE2.

The second inverter IV2 may be connected between the third node N3 and the fourth node N4 generating the comparison result signal SCR. The second equalization switch SWE2 may electrically connect the third node N3 and the fourth node N4 based on the equalization signal EQ.

The feedback circuit 306 may amplify the input node N1 of the first inverting amplification circuit 226 with a rail-to-rail voltage corresponding to a power supply voltage or a ground voltage based on the comparison result signal SCR during the sampling period.

The feedback circuit 306 may include a feedback switch SWF. The feedback switch SWF may electrically connect the fourth node N4 corresponding to the output node of the second inverting amplification circuit 244 and the first node N1 corresponding to the input node of the first inverting amplification circuit 226 based on the latch signal LAT that may be activated during the sampling period PEVAL.

The output inverter IV3 may be connected to the fourth node N4 and performs an inversion and amplification operation based on the comparison result signal SCR to generate an output signal OUT.

Figure 15:
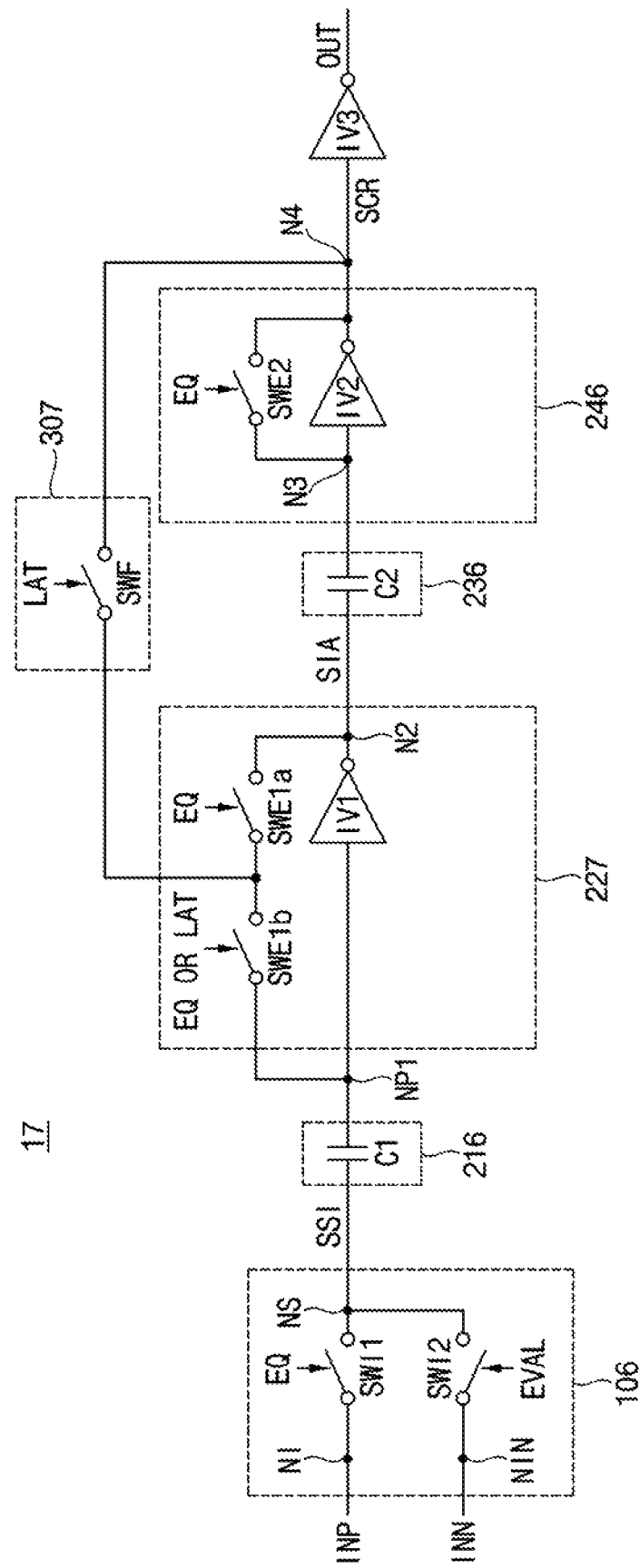

Referring to FIG. 15, a comparator circuit 17 may include an input circuit 106, a first coupling circuit 216, a first inverting amplification circuit 227, a second coupling circuit 236, a second inverting amplification circuit 246, a feedback circuit 307 and output inverter IV3.

The comparator circuit 17 having the single-ended structure of FIG. 15 corresponds to a portion of the comparator circuit 13 having the differential structure of FIG. 11. In other words, the comparator circuit 17 of FIG. 15 may correspond to the configuration of generating the positive output signal OUTP among the comparator circuit 13, or the configuration of generating the negative output signal OUTN among the comparator circuit 13.

Figure 16:
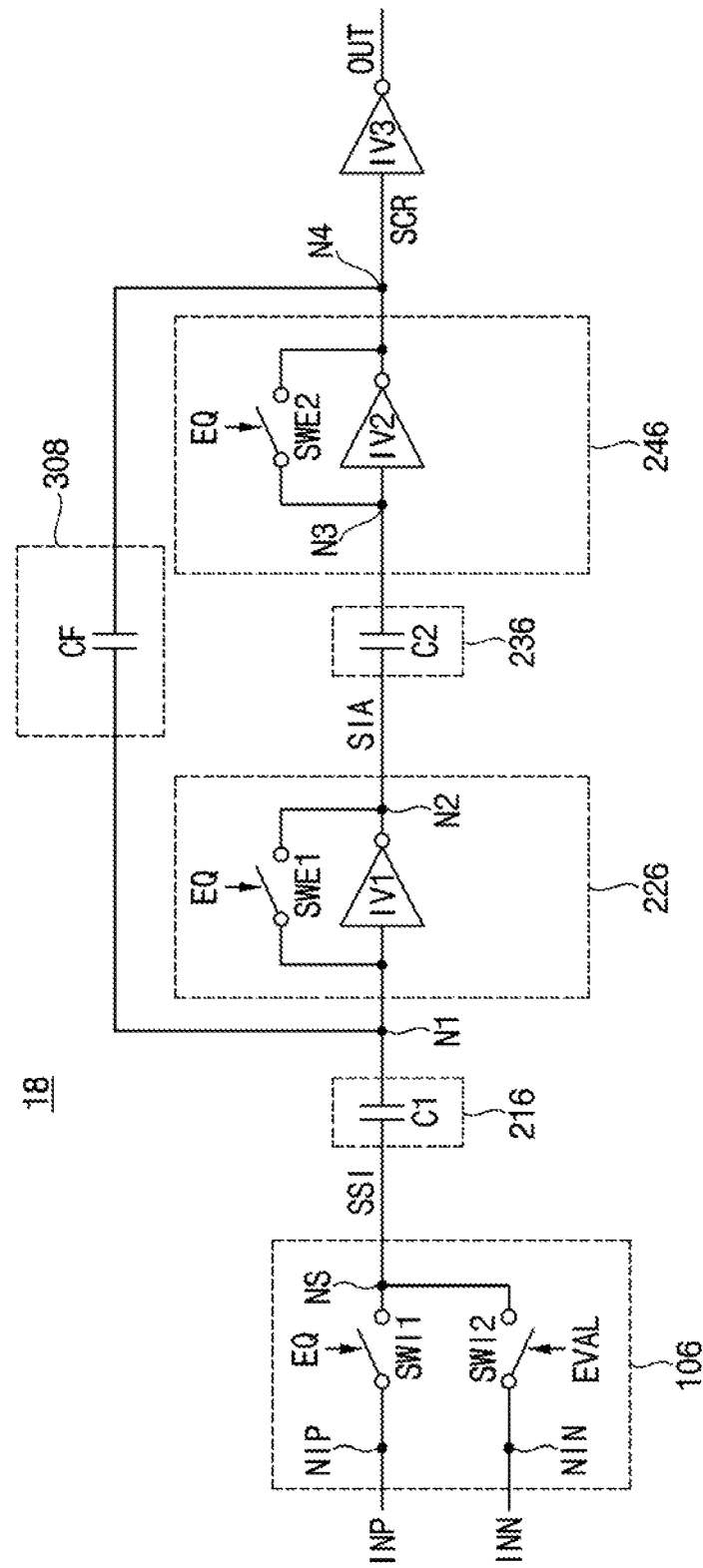

Referring to FIG. 16, a comparator circuit 18 may include an input circuit 106, a first coupling circuit 216, a first inverting amplification circuit 226, a second coupling circuit 236, a second inverting amplification circuit 246, a feedback circuit 308 and output inverter IV3.

The comparator circuit 18 having the single-ended structure of FIG. 16 corresponds to a portion of the comparator circuit 14 having the differential structure of FIG. 12. In other words, the comparator circuit 18 of FIG. 16 may correspond to the configuration of generating the positive output signal OUTP among the comparator circuit 14, or the configuration of generating the negative output signal OUTN among the comparator circuit 14.

Figure 17:
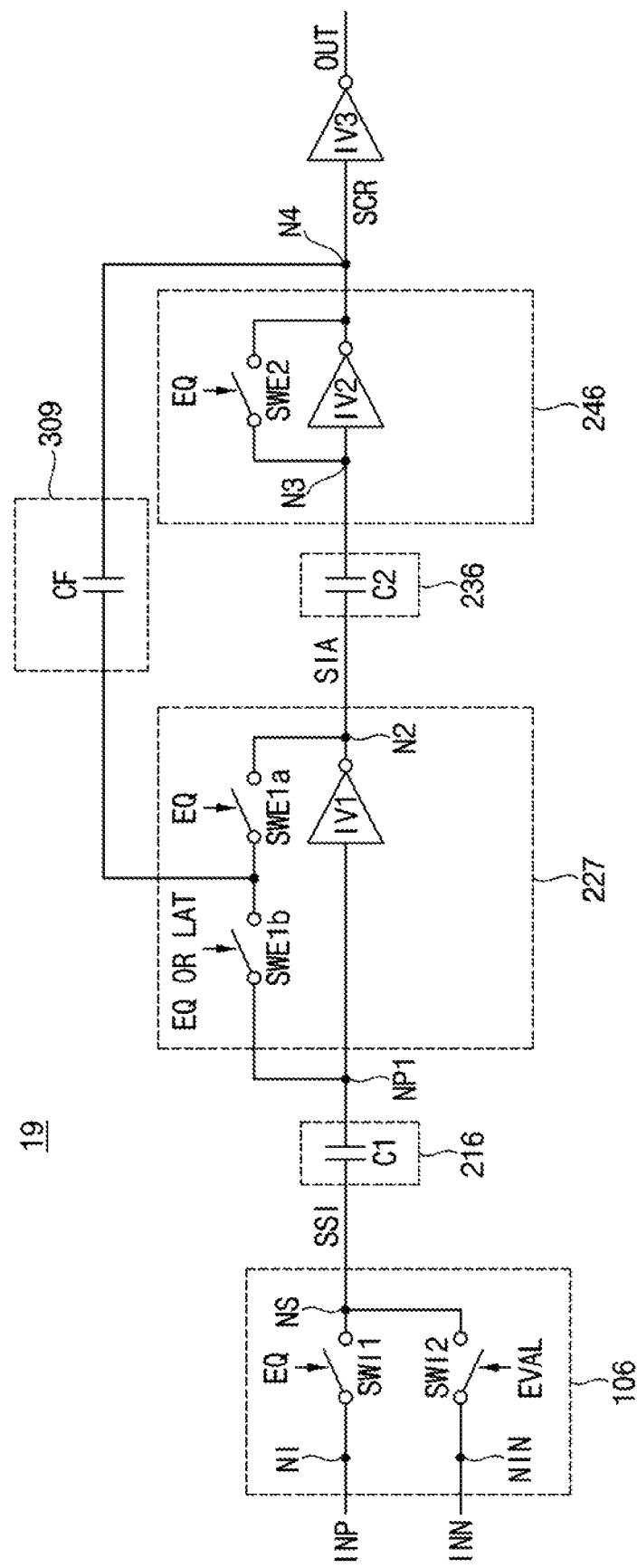

Referring to FIG. 17, a comparator circuit 19 may include an input circuit 106, a first coupling circuit 216, a first inverting amplification circuit 227, a second coupling circuit 236, a second inverting amplification circuit 246, a feedback circuit 309 and output inverter IV3.

The comparator circuit 19 having the single-ended structure of FIG. 17 corresponds to a portion of the comparator circuit 15 having the differential structure of FIG. 13. In other words, the comparator circuit 19 of FIG. 17 may correspond to the configuration of generating the positive output signal OUTP among the comparator circuit 15, or the configuration of generating the negative output signal OUTN among the comparator circuit 15.

Figure 18:
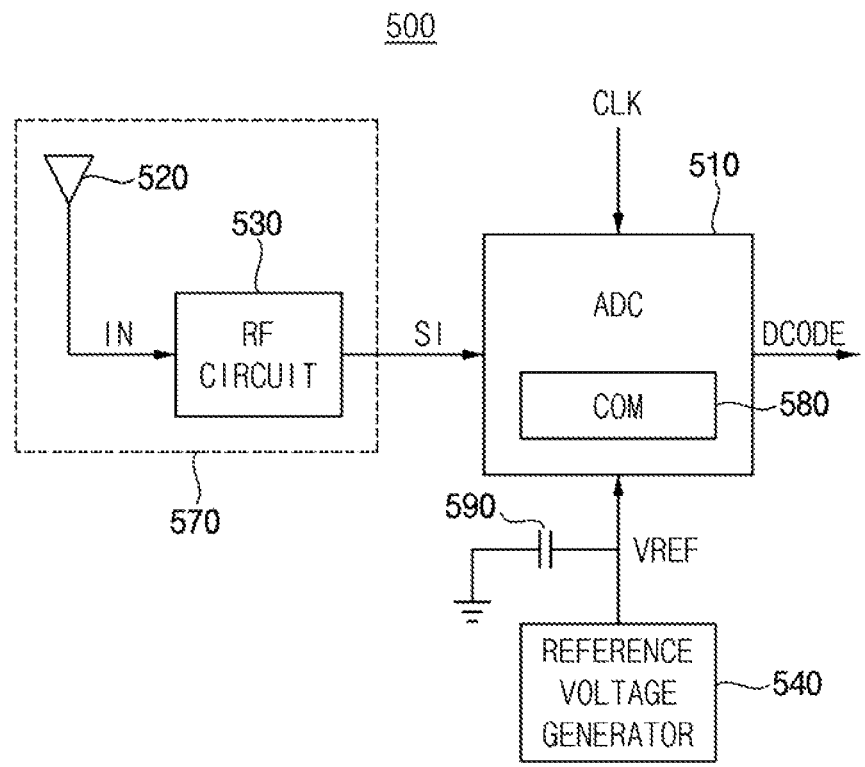
FIG. 18 is a block diagram illustrating a semiconductor device including a comparator circuit according to example embodiments.

FIG. 18 is a block diagram illustrating a semiconductor device including a comparator circuit according to example embodiments.

An example embodiment of a communication device is illustrated in FIG. 18. Example embodiments are not limited to a communication device, however, and may be applied to any device and system including an analog-to-digital converter.

Referring to FIG. 18, the communication device 500 may include an analog-to-digital converter (ADC) 510 of successive approximation register (SAT) type, a reference voltage generator 540 and/or an analog circuit 570. The analog circuit 570 may include an antenna 520 and a radio frequency (RF) circuit 530. In some example embodiments, the communication device may denote a reception terminal that receives various pieces of information. However, example embodiments are not limited thereto. In some example embodiments, the communication device 500 may denote a transmission terminal that transmits various pieces of information, or a transceiver that performs both a reception function and a transmission function. Respective components included in the communication device 500 may be implemented using hardware blocks, such as analog circuits and/or digital circuits, or software blocks such as instructions executed by a processor, etc.

The RF circuit 530 may receive an RF signal IN through the antenna 520 and may generate a baseband signal by performing down-conversion on the received RF signal IN. The baseband signal may be referred to as an analog input signal SI. In some example embodiments, the RF circuit 530 may generate the analog input signal SI by performing direct conversion so that the RF signal IN is directly converted into a baseband signal. In some example embodiments, the RF circuit 530 may convert the RF signal IN into an Intermediated Frequency (IF) signal and may generate the analog input signal SI by performing 2-step down conversion so that the IF signal is converted into the baseband signal.

The ADC 510 may receive the analog input signal SI and may convert the received analog input signal SI into a digital output signal or a digital code DCODE. The ADC 510 may include at least one comparator circuit COM 580 including a feedback circuit according to example embodiments as described above.

The reference voltage generator 540 may generate a reference voltage VREF and may provide the generated reference voltage VREF to the ADC 510.

The ADC 510 may require a decoupling capacitor 590 that is connected to an output terminal of the reference voltage generator 540 that requires very high-power consumption to provide a peak current depending on a high frequency for a capacitor digital-to-analog converter included in the ADC 510. The reference voltage generator 540 may consume power higher than the ADC 510. When a voltage generator of lower power is used to decrease band width, the decoupling capacitor 590 must have a high capacitance to reduce voltage variation due to the peak current. For example, a decoupling capacitor higher than 1 nF is required for an embodiment using 12-bit resolution of the digital code DCODE. In such an embodiment the area of the decoupling capacitor may occupy a significant amount of the entire area of the ADC 510 and the reference voltage generator 540. The occupation area of the decoupling capacitor 590 is increased as the number of the analog-to-digital converters in a semiconductor chip increases.

Power consumption may be reduced using the comparator circuit according to example embodiments, and the size of the decoupling capacitor 590 may be reduced. Accordingly, the size of the entire semiconductor device such as the communication device 500 including the ADC 510 may be reduced.

Figure 19:
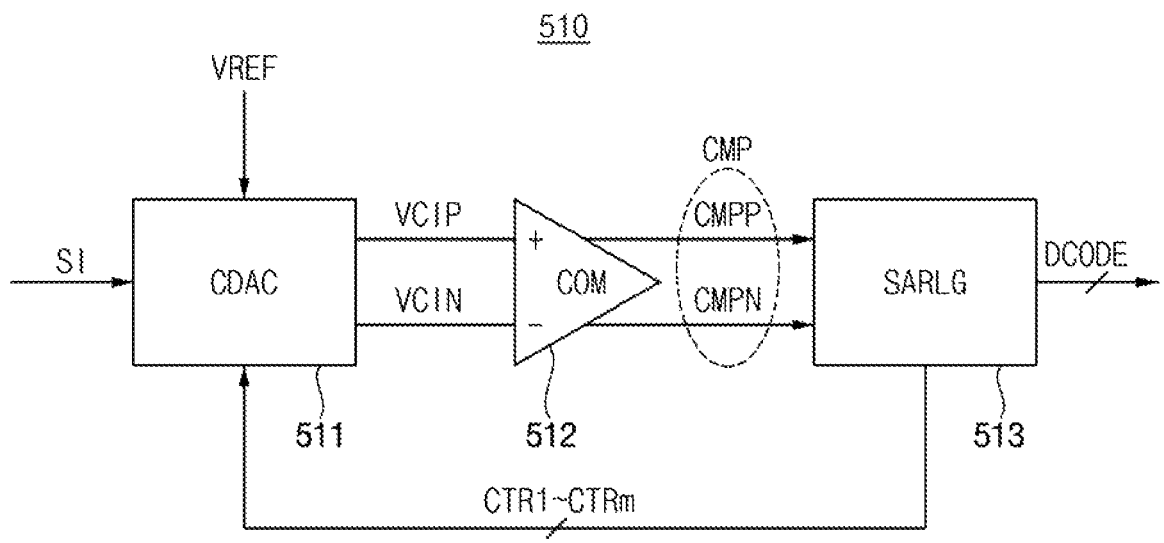
FIG. 19 is a block diagram illustrating an analog-to-digital converter of a successive approximation register (SAR) type including a comparator circuit according to example embodiments.

FIG. 19 is a block diagram illustrating an analog-to-digital converter of a successive approximation register (SAR) type including a comparator circuit according to example embodiments.

Referring to FIG. 19, an analog-to-digital converter 510 may be a SAR-type analog-to-digital converter that performs a binary search conversion to sequentially determine from a most significant bit to a least significant bit of a plurality of bits of a digital output signal corresponding to an analog input signal.

The analog-to-digital converter 510 may include a capacitor digital-to-analog converter (CDAC) 511, a comparator (COM) 512 and/or a SAR logic circuit SARLG 513.

The CDAC 511 may include a plurality of drivers, and each driver may control the comparison input voltages VCIP and VCIN based on the reference voltage VREF.

The comparator 512 may generate a comparison signal by comparing comparison input voltages of comparison input terminals. For example, the comparison input terminals may include a positive input terminal (+) and a negative input terminal (−) and the comparison input voltages may include a positive comparison input voltage VCIP applied to the positive input terminal (+) and a negative comparison input voltage VCIN applied to the negative input terminal (−). The comparator 512 may compare the positive comparison input voltage VCIP and the negative comparison input voltage VIN to generate the comparison signal CMP. FIG. 19 illustrates an example in which the comparator 512 outputs a differential signal pair CMPP and CMPN as the comparison signal CMP. In some example embodiments, the comparator 512 may output a single-ended signal corresponding to one of the signals CMPP and CMPN as the comparison signal CMP. The comparator 512 may be implemented with the comparator circuit including the feedback circuit as described above.

The SAR logic circuit 513 may generate a plurality of control signals CTR1~CTRm based on the comparison signal CMP to control the binary search conversion. The SAR logic circuit 513 may sequentially determine the logic levels of the plurality of control signals CTR1~CTRm one by one through the binary search conversion. After the binary search conversion is completed, the SAR logic circuit 513 may provide the digital output signal DCODE based on the determined logic levels of the plurality of control signals CTR1~CTRm. For example, the digital output signal DCODE may be a digital code including m bits. The plurality of control signals CTR1~CTRm may correspond to the m bits of the digital output signal DCODE, and the positive integer m may indicate the resolution of the analog-to-digital converter 510.

Figure 20:
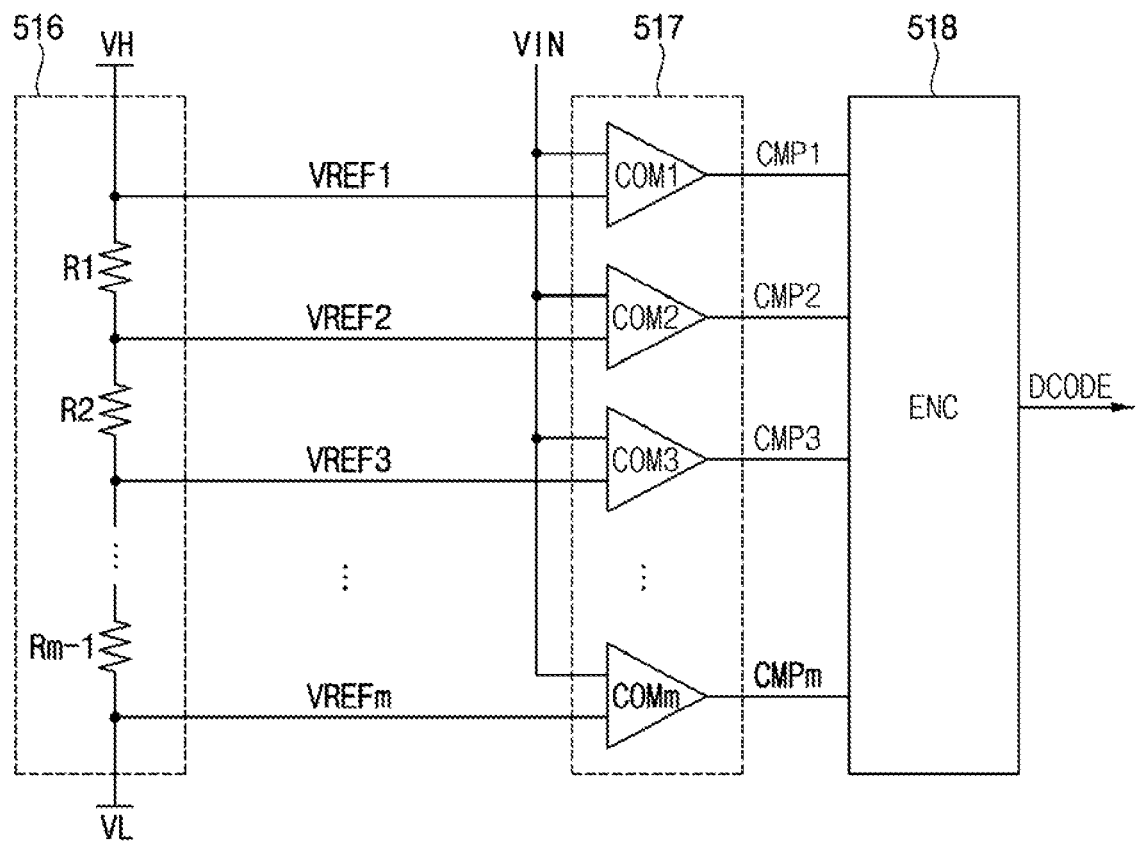
FIG. 20 is a block diagram illustrating an analog-to-digital converter of a parallel comparison type including a comparator circuit according to example embodiments.

FIG. 20 is a block diagram illustrating an analog-to-digital converter of a parallel comparison type including a comparator circuit according to example embodiments.

Referring to FIG. 20, an analog-to-digital converter 515 may include a voltage division circuit 516, a plurality of comparators (COM1~COMm) 517 and an encoder (ENC) 518.

The voltage division circuit 516 may generate a plurality of reference voltages VREF1~VREFm based on a high voltage VH and a low voltage VL using a plurality of resistors R1~Rm−1. The plurality of comparators 517 may compare an input voltage VIN with each of the reference voltages VREF1~VREFm and generate a plurality of comparison result signals CMP1~CMPm. The comparators 517 may reduce the power consumption using the feedback circuit as described above. The encoder 518 may generate a digital code DCODE corresponding to the input voltage VIN based on the comparison result signals CMP1~CMPm.

Figure 21:
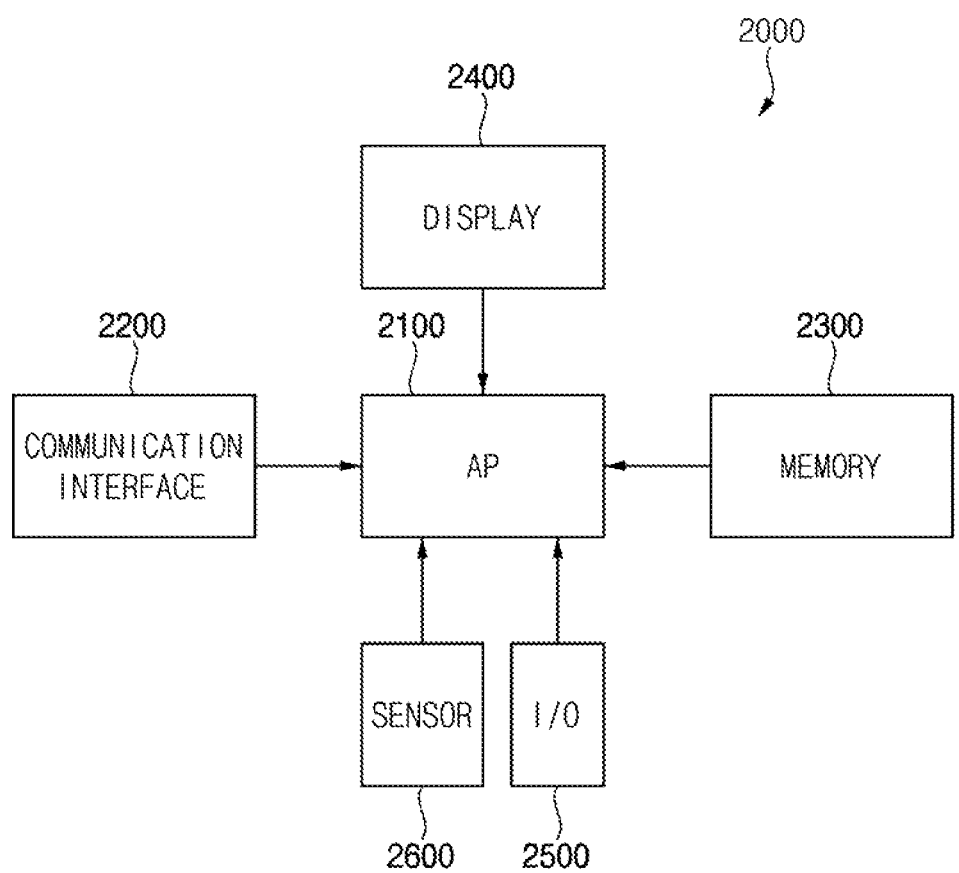
FIG. 21 is a block diagram illustrating an internet of things (IoT) device according to example embodiments.

FIG. 21 is a block diagram illustrating an internet of things (IoT) device according to example embodiments.

Referring to FIG. 21, an ADC using a comparator circuit according to example embodiments as described above may be included in an Internet of Things (IoT) device 2000. IoT may denote a system of internetworking products using wired/wireless communication. An IoT device may have an accessible wired or wireless interface and may exchange data with at least one device via the wired or wireless interface. The accessible wired or wireless interface may include a Local Area Network (LAN), a Wireless Local Area Network (WLAN) such as Wi-Fi, a Wireless Personal Area Network (WPAN) such as Bluetooth, a Wireless Universal Serial Bus (USB), Zigbee, Near Field Communication (NFC), Radio-frequency Identification (RFID), Power Line Communication (PLC), a modem communication interface, e.g., third generation (3G), fourth generation (4G), or Long Term Evolution (LTE), which may access a mobile cellular network. The Bluetooth interface may support Bluetooth Low Energy (BLE).

In particular, the IoT device 2000 may include a communication interface 2200 to communicate with an external device. The communication interface 2200 may be, for example, a wireless short-range communication interface such as a LAN, Bluetooth, Wi-Fi, or Zigbee, or a modem communication interface, e.g., PLC, 3G, or LTE, which may access a mobile communication network. The communication interface 2200 may include a transmitter, a receiver or a transceiver (transmitter and receiver). The IoT device 2000 may transmit information to and/or receive information from an access point or a gateway through the communication interface. Also, the IoT device 2000 may transmit and/or receive control information or data of the IoT device 2000 by communicating with a user device or another IoT device.

In some example embodiments, the receiver of the communication interface 2200 may include an ADC, and the ADC may include at least one comparator circuit according to the descriptions provided with reference to FIGS. 1 to 17. In particular, the receiver of the communication interface 2200 may include a SAR-type ADC, and the SAR-type ADC may include the comparator circuit including the feedback circuit.

The IoT device 2000 may include a processor, such as an AP 2100, for executing an arithmetic operation. The IoT device 2000 may further include a power supply, such as a battery or an external power supply which receives power from an outside source. Also, the IoT device 2000 may include a display 2400 for displaying data, such as an internal state of the IoT device 2000. The user may control the IoT device 2000 via a user interface (UI) of the display 2400. The IoT device 2000 may transmit the internal state and/or data through the transmitter and may receive a control instruction and/or data from the outside through the receiver.

A memory 2300 may store a control instruction code for controlling the IoT device 2000, control data, or user data.

The memory 2300 may include at least one of a volatile memory and a non-volatile memory. The non-volatile memory may include at least one of Read Only Memory (ROM), Programmable ROM (PROM), Electrically Programmable ROM (EPROM), Electrically Erasable, Programmable ROM (EEPROM), flash memory, Phase-change random access memory (PRAM), Magnetic RAM (MRAM), Resistive RAM (ReRAM), and Ferroelectric RAM (FRAM). The volatile memory may include at least one of Dynamic RAM (DRAM), Static RAM (SRAM), and Synchronous DRAM (SDRAM).

The IoT device 2000 may further include a storage device. The storage device may be a non-volatile medium such as hard disk drive (HDD), Solid State Disk (SSD), an embedded Multi Media Card (eMMC), or Universal Flash Storage (UFS). The storage device may store user information provided via an input/output (I/O) device 2500 and sensing information collected through a sensor 2600.

Figure 22:
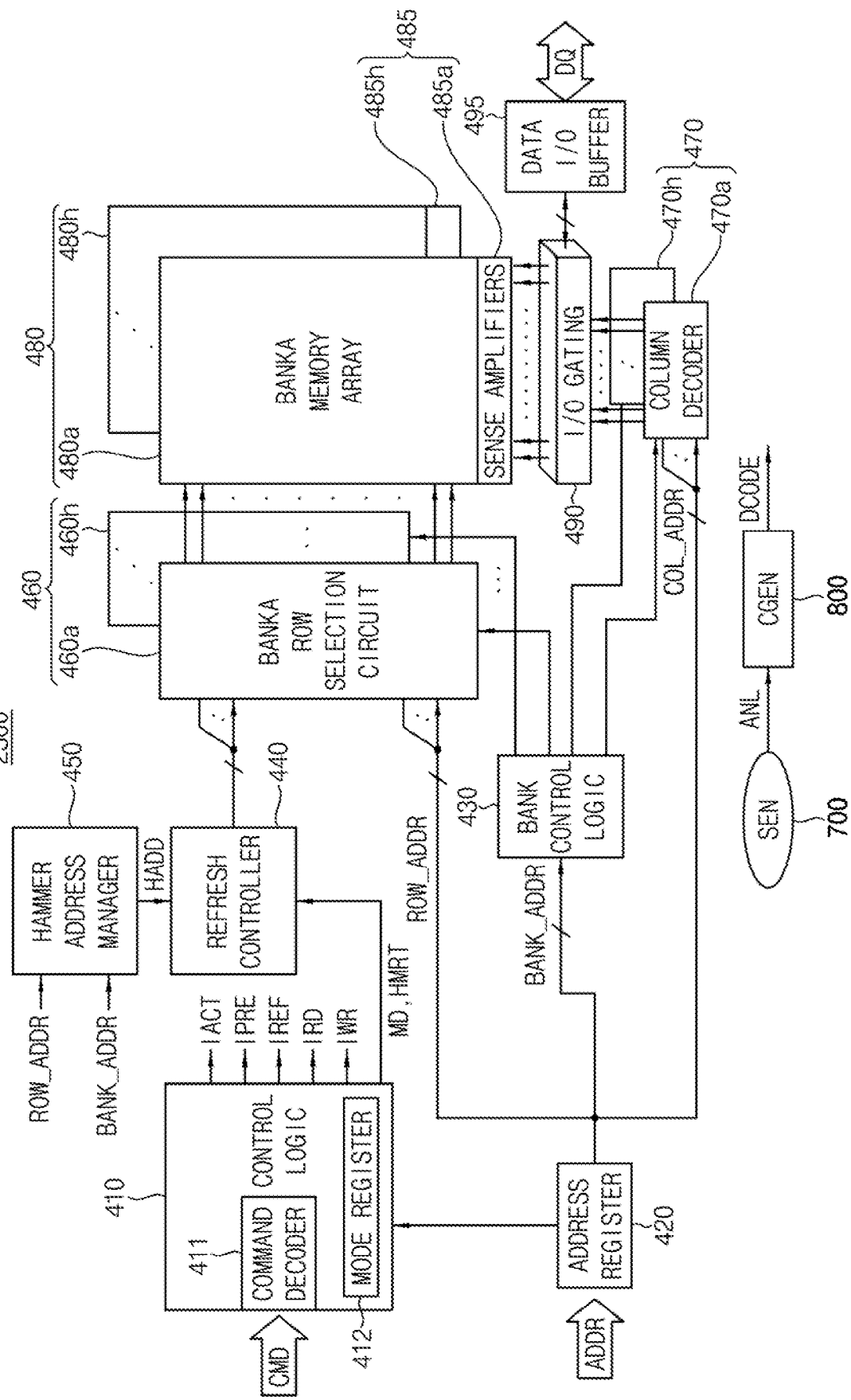
FIG. 22 is a block diagram illustrating a memory device including a comparator circuit according to example embodiments.

FIG. 22 is a block diagram illustrating a memory device including a comparator circuit according to example embodiments.

Referring to FIG. 22, a memory device 2300 may include a control logic 410, an address register 420, a bank control logic 430, a row selection circuit 460 (or row decoder), a column decoder 470, a memory cell array 480, a sense amplifier unit 485, an input/output (I/O) gating circuit 490, a data input/output (I/O) buffer 495, a refresh controller 440, a hammer address manager 450, a sensor (SEN) 700, and a code generator (CGEN) 800.

The memory cell array 480 may include a plurality of bank arrays 480a-480h. The row selection circuit 460 may include a plurality of bank row selection circuits 460a-460h respectively coupled to the bank arrays 480a-480h. The column decoder 470 may include a plurality of bank column decoders 470a-470h respectively coupled to the bank arrays 480a-480h. The sense amplifier unit 485 may include a plurality of bank sense amplifiers 485a-485h respectively coupled to the bank arrays 480a-480h.

The address register 420 may receive an address ADDR including a bank address BANK_ADDR, a row address ROW_ADDR, and a column address COL_ADDR from the memory controller 200. The address register 420 may provide the received bank address BANK_ADDR to the bank control logic 430, may provide the received row address ROW_ADDR to the row selection circuit 460, and may provide the received column address COL_ADDR to the column decoder 470.

The bank control logic 430 may generate bank control signals in response to the bank address BANK_ADDR. One of the bank row selection circuits 460a-460h corresponding to the bank address BANK_ADDR may be activated in response to the bank control signals, and one of the bank column decoders 470a-470h corresponding to the bank address BANK_ADDR may be activated in response to the bank control signals.

The row address ROW_ADDR from the address register 420 may be applied to the bank row selection circuits 460a-460h. The activated one of the bank row selection circuits 460a-460h may decode the row address ROW_ADDR, and may activate a wordline corresponding to the row address ROW_ADDR. For example, the activated bank row selection circuit 460 may apply a wordline driving voltage to the wordline corresponding to the row address ROW_ADDR.

The column decoder 470 may include a column address latch. The column address latch may receive the column address COL_ADDR from the address register 420 and may temporarily store the received column address COL_ADDR. In some example embodiments, in a burst mode, the column address latch may generate column addresses that increment from the received column address COL_ADDR. The column address latch may apply the temporarily stored or generated column address to the bank column decoders 470a-470h.

The activated one of the bank column decoders 470a-470h may decode the column address COL_ADDR and may control the I/O gating circuit 490 in order to output data corresponding to the column address COL_ADDR.

The I/O gating circuit 490 may include a circuitry for gating input/output data. The I/O gating circuit 490 may further include read data latches for storing data that is output from the bank arrays 480a-480h and write drivers for writing data to the bank arrays 480a-480h.

Data to be read from one bank array of the bank arrays 480a-480h may be sensed by one of the bank sense amplifiers 485a-485h coupled to the one bank array from which the data is to be read and may be stored in the read data latches. The data stored in the read data latches may be provided to the memory controller via the data I/O buffer 495. Data DQ to be written in one bank array of the bank arrays 480a-480h may be provided to the data I/O buffer 495 from the memory controller. The write driver may write the data DQ in one bank array of the bank arrays 480a-480h.

The control logic 410 may control operations of the memory device 2300. For example, the control logic 410 may generate control signals for the memory device 2300 in order to perform a write operation, a read operation, or a refresh operation. The control logic 410 may generate internal command signals such as an active signal TACT, a precharge signal IPRE, a refresh signal IREF, a read signal IRD, a write signal IWR, etc., based on commands CMD transferred from the memory controller. The control logic 410 may include a command decoder 411 that decodes the commands CMD received from the memory controller and a mode register set 412 that sets an operation mode of the memory device 2300.

Although FIG. 22 illustrates the control logic 410 and the address register 420 as being distinct from each other, the control logic 410 and the address register 420 may be implemented as a single integrated circuit. In addition, although FIG. 22 illustrates the command CMD and the address ADDR being provided as distinct signals, the command CMD and the address ADDR may be provided as a combined signal, e.g., as specified by LPDDR5 standards.

The hammer address manager 450 may manage access addresses synthetically with respect to the plurality of bank arrays 480a-480h based on the bank address BANK_ADDR and the row address ROW_ADDR and may provide a hammer address HADD for a hammer refresh operation among the access addresses, where the hammer address HADD is an address that is accessed intensively. The refresh controller 440 may generate a hammer refresh address signal based on the hammer address HADD, where the hammer refresh address signal represents a row (e.g., a victim wordline) that is physically adjacent to a row (e.g., a hammer wordline) corresponding to the hammer address HADD.

The sensor 700 may generate an analog signal ANL by measuring physical quantities such as a temperature, a voltage, and so on. The code generator 800 may generate the digital code DCODE by converting the analog signal ANL. The code generator 800 may include an analog-to-digital converter and the analog-to-digital converter may include at least one comparator circuit according to example embodiments.

The control logic 410 may store and provide the hammer control information HCINF, that is, the mode information MD and the hammer ratio information HMRT, to the refresh controller 440. The refresh controller 440 may vary the hammer ratio based on the hammer control information HCINF in a variable hammer control mode.

Figure 23:
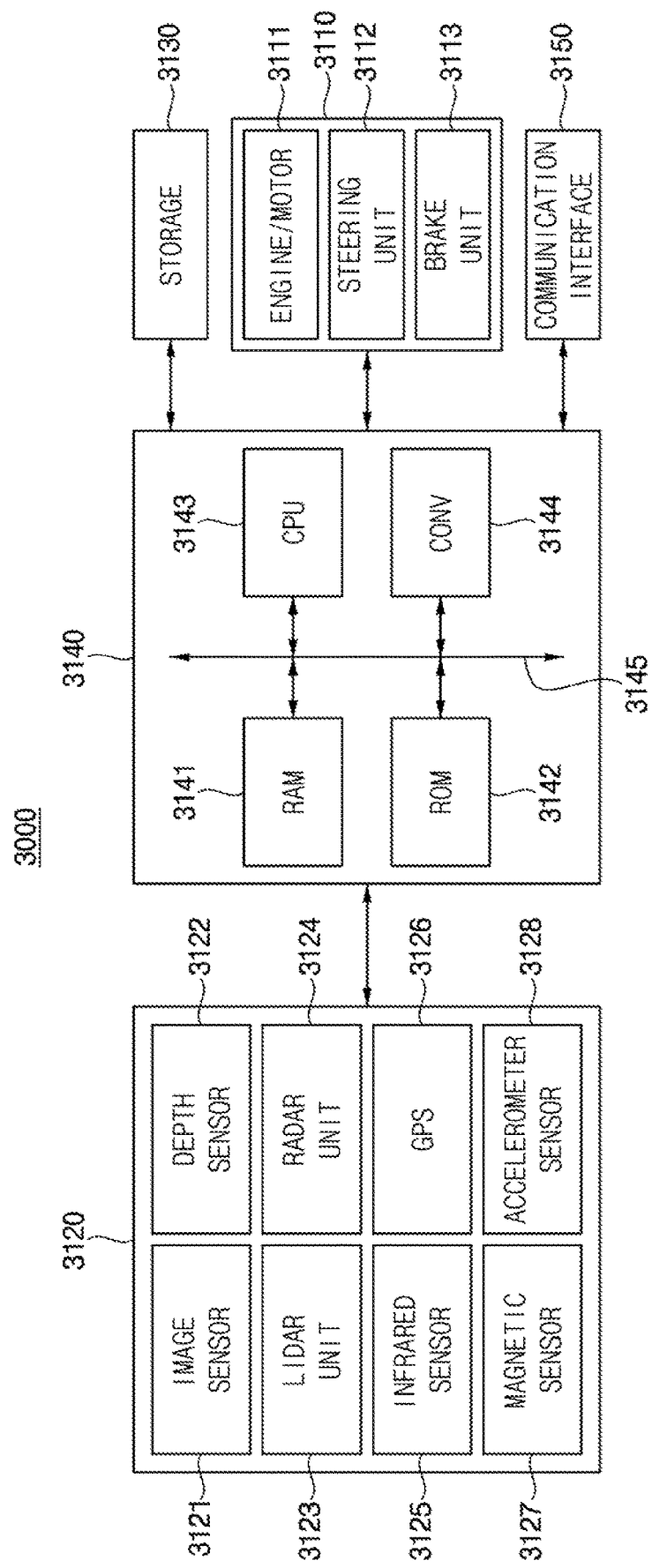
FIG. 23 is a block diagram illustrating an autonomous driving device including a comparator circuit according to example embodiments.

FIG. 23 is a block diagram illustrating an autonomous driving device including a comparator circuit according to example embodiments.

Referring to FIG. 23, an autonomous driving device 3000 may include a driver (e.g., including circuitry) 3110, a sensor 3120, a storage 3130, a controller (e.g., including processing circuitry) 3140, and a communication interface 3150.

The driver 3110 may, for example, be a configuration for driving the autonomous driving device 3000 and may include various circuitry. In a case that the autonomous driving device 3000 is implemented as a vehicle, the driver 3110 may include various circuitry and/or components, such as, for example, an engine/motor 3111, a steering unit 3112, a brake unit 3113 and the like.

The engine/motor 3111 may include any combination of an internal combustion engine, an electric motor, a steam locomotive, and a Stirling engine. For example, in a case that the autonomous driving device 3000 is a gas-electric hybrid car, the engine/motor 3111 may be a gasoline engine and an electric motor. For example, the engine/motor 3111 may supply energy for the autonomous driving device 3000 to drive on a predetermined driving route.

The steering unit 3112 may be any combination of mechanisms included to control a direction of the autonomous driving device 3000. For example, when an obstacle is recognized while the autonomous driving device 3000 is driving, the steering unit 3112 may change the direction of the autonomous driving device 3000. In a case that the autonomous driving device 3000 is a vehicle, the steering unit 3112 may turn the steering wheel clockwise or counterclockwise and change the direction of the autonomous driving device 3000 accordingly.

The brake unit 3113 may be any combination of mechanisms included to decelerate the autonomous driving device 3000. For example, the brake unit may use friction to reduce a speed of wheels/tires. When an obstacle is recognized while the autonomous driving device 3000 is driving, the brake unit 3113 may decelerate or slow the autonomous driving device 3000.

The driver 3110 may be an autonomous driving device 3000 driving or traveling on the ground, but embodiments are not limited thereto. The driver 3110 may include a flight propulsion unit, a propeller, wings, etc. and may include a variety of vessel propulsion devices.

The sensor 3120 may include a number of sensors configured to sense information relating to a surrounding environment of the autonomous driving device 3000. For example, the sensor 3120 may include at least one of an image sensor 3121, a depth camera 3122, a LIDAR unit 3123, a RADAR unit 3124, an infrared sensor 3125, a Global Positioning System (GPS) 3126, a magnetic sensor 3127, and/or an accelerometer sensor 3128.

The image sensor 3121 may capture an image of or other data related to an external object located outside of the autonomous driving device 3000. The captured image or other data related to the external device may be used as data for changing at least one of a velocity and direction of the autonomous driving device 3000. The image sensor 3121 may include a sensor of various types, such as a charge coupled device (CCD) and a complementary metal oxide semiconductor (CMOS). In addition, the depth camera 3122 may acquire a depth for determining a distance between the autonomous driving device 3000 and an external object.

The LIDAR unit 3123, the RADAR unit 3124, and the infrared sensor 3125 may each include a sensor configured to output a particular signal and sense external objects in an environment in which the autonomous driving device 3000 is located. For example, the LIDAR unit 3123 may include a laser light source and/or laser scanner configured to radiate a laser, and a detector configured to detect reflection of the laser. The RADAR unit 3124 may be a sensor configured to sense objects in the environment in which the autonomous driving device 3000 is located, using a wireless signal. In addition, the RADAR unit 3124 may be configured to sense speeds and/or directions of the objects. The infrared sensor 3125 may be a sensor configured to sense external objects in an environment in which the autonomous driving device 3000 is located using a light of a wavelength of an infrared area.

The GPS 3126, the magnetic sensor 3127, and the accelerometer sensor 3128 may each include a sensor configured to acquire information relating to a velocity, direction, location, etc. of the autonomous driving device 3000. For example, information relating to a current state of the autonomous driving device 3000 may be acquired and a possibility of collision with an external object, etc. may be identified and/or estimated. The GPS 3126 may receive a location of the autonomous driving device 3000 as a latitude and altitude data through a satellite, and the magnetic sensor 3127 and the accelerometer sensor 3128 may identify the current state of the autonomous driving device 3000 according to momentum of the autonomous driving device 3000.

The storage 3130 may store data necessary for the controller 3140 to execute various processing. For example, the storage 3130 may be realized as an internal memory such as ROM, RAM and the like included in the controller 3140, and may be realized as a separate memory from the controller 3140. In this case, the storage 3130 may be realized in the form of a memory embedded in the autonomous driving device 3000 or may be realized in the form of a memory that may be detachable from the autonomous driving device 3000 according to the usage of data storage. For example, data for driving the autonomous driving device 3000 may be stored in a memory embedded in the autonomous driving device 3000, and data for an extension function of the autonomous driving device 3000 may be stored in a memory that may be detached from the autonomous driving device 3000. The memory embedded in the autonomous driving device 3000 may be realized in the form of a non-volatile memory, volatile memory, flash memory, hard disk drive (HDD), solid state drive (SDD), or the like, and the memory that may be detached from the autonomous driving device 3000 may be realized in the form of a memory card (e.g., micro SD card, USB memory), an external memory that is connectable to a USB port (e.g. USB memory), and the like.

The communication interface 3150 may include various communication circuitry and may be configured to facilitate communication between the autonomous driving device 3000 and an external device. For example, the communication interface 3150 may transmit and receive driving information of the autonomous driving device 3000 to and from the external device. For example, the communication interface 3150 may perform communication through various communication methods such as an Infrared (IR) communication, a Wireless Fidelity (WI-FI), Bluetooth, Zigbee, Beacon, near field communication (NFC), WAN, Ethernet, IEEE 1394, HDMI, USB, MHL, AES/EBU, Optical, Coaxial, and the like. In some embodiments, the communication interface 3150 may communicate driving information through a server (not illustrated).

The controller 3140 may include a random access memory (RAM) 3141, a read only memory (ROM) 3142, a central processing unit (CPU) 3143, a converter (CONV) 3144 and a bus 3145. The RAM 3141, the ROM 3142, the CPU 143 and the CONV 3144 may be connected to each other through the bus 3155. The controller 3140 may be realized as a system on chip (SoC).

The RAM 3141 may be a memory for reading, from the storage 3130, various instructions, etc. related to driving of the autonomous driving device 3000. The ROM 3142 may store a set of instructions for system booting. In response to a turn on command being input to the autonomous driving device 3000 and power being supplied, the CPU 3143 may copy an O/S stored in the storage 3130 into the RAM 3141 according to a command stored in the ROM 3142, and boot the system by executing the 0/S. If booting is completed, the CPU 3143 performs various operations by copying various types of application programs stored in the storage 3130 into the RAM 3141 and executing the application programs copied into the RAM 3141. The controller 3140 may perform various operations using a module stored in the storage 3130.

The CONV 3144 may include an analog-to-digital converter as described above, and the analog-to-digital converter may include at least one comparator circuit including a feedback circuit according to example embodiments. The CONV 3144 may convert analog signals obtained by the sensor 3120 to digital signals and provide the digital signals to the CPU 3142. In addition, the CONV may convert digital control signals from the CPU 3142 to analog signals to control the driver 3110.

As described above, the comparator circuit according to example embodiments may reduce the operation current of the first inverting amplification circuit by amplifying the input node of the first inverting amplification circuit with the rail-to-rail voltage during the sampling period using the feedback circuit. Through reduction of the operation current, the power consumption of the comparator circuit, various semiconductor devices and integrated circuits including the comparator circuit may be reduced.

Embodiments are directed to systems such as a memory card, a solid state drive (SSD), an embedded multimedia card (eMMC), a universal flash storage (UFS), a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, a server system, an automotive device, etc.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A comparator circuit comprising:
   an input circuit configured to generate an amplified input signal through a sampling node by alternately selecting a positive input voltage and a negative input voltage during an equalizing period and a sampling period;
   a first inverting amplification circuit configured to generate an intermediate amplified signal by performing an inversion and amplification operation based on the amplified input signal during the sampling period;
   a second inverting amplification circuit configured to generate a comparison result signal by performing an inversion and amplification operation based on the intermediate amplified signal during the sampling period;
   a first coupling circuit connected between the input circuit and an input node of the first inverting amplification circuit;
   a second coupling circuit connected between an output node of the first inverting amplification circuit and an input node of the second inverting amplification circuit; and
   a feedback circuit configured to amplify the input node of the first inverting amplification circuit with a rail-to-rail voltage corresponding to a power supply voltage or a ground voltage based on the comparison result signal during the sampling period,
   wherein the first inverting amplification circuit includes:
   a first inverter connected between the input node of the first inverting amplification circuit and the output node of the first inverting amplification circuit;
   a first equalization switch connected in parallel with the first inverter between the input node of the first inverting amplification circuit and the output node of the first inverting amplification circuit and configured to be turned on based on an equalization signal having an activation period corresponding to the equalizing period; and
   a second equalization switch connected in series with the first equalization switch between the input nod of the first inverting amplification circuit and the output node of the first inverting amplification circuit and configured to be turned on based on at least on of the equalization signal or a latch signal that is activated during the sampling period.

2. The comparator circuit as claimed in claim 1, wherein the comparator circuit reduces an operation current of the first inverting amplification circuit by amplifying the input node of the first inverting amplification circuit with the rail-to-rail voltage.

3. The comparator circuit as claimed in claim 1, wherein the feedback circuit includes:
   a feedback switch configured to electrically connect an output node of the second inverting amplification circuit and the input node of the first inverting amplification circuit based on a latch signal that is activated during the sampling period.

4. The comparator circuit as claimed in claim 1, wherein the feedback circuit includes:
   a feedback capacitor connected between an output node of the second inverting amplification circuit and the input node of the first inverting amplification circuit.

5. The comparator circuit as claimed in claim 1, wherein the feedback circuit includes:
a feedback switch configured to electrically connect the output node of the second inverting amplification circuit and a connection node between the first equalization switch and the second equalization switch based on the latch signal.

6. The comparator circuit as claimed in claim 1, wherein the feedback circuit includes:
a feedback capacitor connected between the output node of the second inverting amplification circuit and a connection node between the first equalization switch and the second equalization switch.

7. The comparator circuit as claimed in claim 1, wherein the comparator circuit has a differential structure to generate a complementary pair of a positive comparison result signal and a negative comparison result signal.

8. The comparator circuit as claimed in claim 7,
wherein the first inverting amplification circuit includes:
a first positive inverter connected between a first positive node corresponding to a first input node of the first inverting amplification circuit and a second positive node corresponding to a first output node of the first inverting amplification circuit; and
a first negative inverter connected between a first negative node corresponding to a second input node of the first inverting amplification circuit and a second negative node corresponding to a second output node of the first inverting amplification circuit, and wherein the second inverting amplification circuit includes:
a second positive inverter connected between a third positive node corresponding a first input node of the second inverting amplification circuit and a fourth positive node corresponding to a first output node of the second inverting amplification circuit, the fourth positive node generating the positive comparison result signal; and
a second negative inverter connected between a third negative node corresponding to a second input node of the second inverting amplification circuit and a fourth negative node corresponding to a second output node of the second inverting amplification circuit, the fourth negative node generating the negative comparison result signal.

9. The comparator circuit as claimed in claim 8, further comprising:
a third positive inverter connected between the fourth positive node and a positive output node and configured to generate a positive output signal at the positive output node by performing an inversion and amplification operation based on the positive comparison result signal; and
a third negative inverter connected between the fourth negative node and a negative output node and configured to generate a negative output signal at the negative output node by performing an inversion and amplification operation based on the negative comparison result signal.

10. The comparator circuit as claimed in claim 9, wherein the feedback circuit includes:
a positive feedback switch configured to electrically connect the negative output node and the first positive node based on a latch signal that is activated during the sampling period; and
a negative feedback switch configured to electrically connect the positive output node and the first negative node based on the latch signal.

11. The comparator circuit as claimed in claim 9, wherein the feedback circuit includes:
a positive feedback capacitor connected between the negative output node and the first positive node; and
a negative feedback capacitor connected between the positive output node and the first negative node.

12. The comparator circuit as claimed in claim 8,
wherein the first coupling circuit includes:
a first positive coupling capacitor connected between a positive sampling node of the input circuit and the first positive node; and
a first negative coupling capacitor connected between a negative sampling node of the input circuit and the first negative node, and wherein the second coupling circuit includes:
a second positive coupling capacitor connected between the second positive node and the third positive node; and
a second negative coupling capacitor connected between the second negative node and the third negative node.

13. The comparator circuit as claimed in claim 12, wherein the input circuit includes:
a first positive input switch configured to electrically connect a positive input node receiving the positive input voltage and the positive sampling node that outputs a positive amplified input signal based on an equalization signal having an activation period corresponding to the equalizing period;
a second positive input switch configured to electrically connect a negative input node receiving the negative input voltage and the positive sampling node based on a sampling signal having an activation period corresponding to the sampling period;
a first negative input switch configured to electrically connect the negative input node and the negative sampling node that outputs a negative amplified input signal based on the equalization signal; and
a second negative input switch configured to electrically connect the positive input node and the negative sampling node based on the sampling signal.

14. The comparator circuit as claimed in claim 8, wherein the second inverting amplification circuit includes:
a first latching switch configured to electrically connect the fourth positive node and the third negative node based on a latch signal that is activated during the sampling period; and
a second latching switch configured to electrically connect the fourth negative node and the third positive node based on the latch signal.

15. The comparator circuit as claimed in claim 1, wherein the input circuit generates the amplified input signal based on an equalization signal having an activation period corresponding to the equalizing period and a sampling signal having an activation period corresponding to the sampling period,
wherein the first inverting amplification circuit and the second inverting amplification circuit perform an equalization operation during the equalizing period to electrically connect an input and output of an inverter included in the first inverting amplification circuit and an input and output of an inverter included in the second inverting amplification circuit based on the equalization signal, and wherein the feedback circuit amplifies an input node of the first inverting amplification circuit with the rail-to-rail voltage based on a latch signal that is activated during the sampling period.

16. The comparator circuit as claimed in claim 15, wherein the latch signal is a copy of the sampling signal, delayed by a delay time.

17. The comparator circuit as claimed in claim 15, wherein the latch signal is activated after a delay time from an activation time point of the sampling signal and the latch signal is deactivated at a deactivation time point of the sampling signal.

18. A comparator circuit comprising:
an input circuit configured to generate a positive amplified input signal through a positive sampling node and generate a negative amplified input signal through a negative sampling node by alternately selecting a positive input voltage and a negative input voltage during an equalizing period and a sampling period;
a first positive coupling capacitor connected between the positive sampling node and a first positive node;
a first negative coupling capacitor connected between the negative sampling node and a first negative node, and
a first positive inverter connected between the first positive node and a second positive node;
a first negative inverter connected between the first negative node and a second negative node;
a first positive equalization switch configured to electrically connect the first positive node and the second positive node based on an equalization signal having an activation period corresponding to the equalizing period;
a first negative equalization switch configured to electrically connect the first negative node and the second negative node based on the equalization signal;
a second positive coupling capacitor connected between the second positive node and a third positive node;
a second negative coupling capacitor connected between the second negative node and a third negative node;
a second positive inverter connected between the third positive node and a fourth positive node;
a second negative inverter connected between the third negative node and a fourth negative node;
a second positive equalization switch configured to electrically connect the third positive node and a fourth positive node based on the equalization signal;
a second negative equalization switch configured to electrically connect the third negative node and a fourth negative node based on the equalization signal;
a first latching switch configured to electrically connect the fourth positive node and the third negative node based on a latch signal that is activated during the sampling period;
a second latching switch configured to electrically connect the fourth negative node and the third positive node based on the latch signal;
a positive feedback switch configured to electrically connect the fourth positive node and the first positive node based on the latch signal; and
a negative feedback switch configured to electrically connect the fourth negative node and the first negative node based on the latch signal.

19. A comparator circuit comprising:
an input circuit configured to generate an amplified input signal through a sampling node by alternately selecting a positive input voltage and a negative input voltage during an equalizing period and a sampling period;
a first inverting amplification circuit configured to generate an intermediate amplified signal by performing an inversion and amplification operation based on the amplified input signal during the sampling period;
a second inverting amplification circuit configured to generate a comparison result signal by performing an inversion and amplification operation based on the intermediate amplified signal during the sampling period;
a first coupling circuit connected between the input circuit and an input node of the first inverting amplification circuit;
a second coupling circuit connected between an output node of the first inverting amplification circuit and an input node of the second inverting amplification circuit; and
a feedback circuit configured to amplify the input node of the first inverting amplification circuit with a rail-to-rail voltage corresponding to a power supply voltage or a ground voltage based on the comparison result signal during the sampling period,
wherein the comparator circuit has a differential structure to generate a complementary pair of a positive comparison result signal and a negative comparison result signal,
wherein the first inverting amplification circuit includes:
a first positive inverter connected between a first positive node corresponding to a first input node of the first inverting amplification circuit and a second positive node corresponding to a first output node of the first inverting amplification circuit; and
a first negative inverter connected between a first negative node corresponding to a second input node of the first inverting amplification circuit and a second negative node corresponding to a second output node of the first inverting amplification circuit, wherein the second inverting amplification circuit includes:
a second positive inverter connected between a third positive node corresponding a first input node of the second inverting amplification circuit and a fourth positive node corresponding to a first output node of the second inverting amplification circuit, the fourth positive node generating the positive comparison result signal; and
a second negative inverter connected between a third negative node corresponding to a second input node of the second inverting amplification circuit and a fourth negative node corresponding to a second output node of the second inverting amplification circuit, the fourth negative node generating the negative comparison result signal, and wherein the second inverting amplification circuit includes:
a first latching switch configured to electrically connect the fourth positive node and the third negative node based on a latch signal that is activated during the sampling period; and
a second latching switch configured to electrically connect the fourth negative node and the third positive node based on the latch signal.

* * * * *